United States Patent
Kwon et al.

(10) Patent No.: US 7,109,790 B2
(45) Date of Patent: Sep. 19, 2006

(54) HIGH LINEARITY DOHERTY COMMUNICATION AMPLIFIER WITH INTEGRATED OUTPUT MATCHING UNIT

(76) Inventors: Youngwoo Kwon, 103 Hyunjin Villa, Bundang-dong, Bundang-gu, Seongnam, Kyunggi-Do (KR); Junghyun Kim, 105-404 Samsung APT, 414, Neson-dong, Uiwang City (KR)

( * ) Notice: Subject to any disclaimer, the term of this patent is extended or adjusted under 35 U.S.C. 154(b) by 0 days.

(21) Appl. No.: 10/737,476

(22) Filed: Dec. 15, 2003

(65) Prior Publication Data
US 2004/0145416 A1 Jul. 29, 2004

Related U.S. Application Data

(63) Continuation-in-part of application No. 10/432,533, filed as application No. PCT/KR02/00163 on Feb. 4, 2002.

(30) Foreign Application Priority Data
Feb. 1, 2002 (KR) ................... 2002-5924

(51) Int. Cl.
*H03F 3/68* (2006.01)
(52) U.S. Cl. ................... 330/124 R; 330/286; 330/295
(58) Field of Classification Search ............ 330/124 R, 330/295
See application file for complete search history.

(56) References Cited

U.S. PATENT DOCUMENTS

| | | | |
|---|---|---|---|
| 2,210,028 A | 8/1940 | Doherty | |
| 4,335,363 A | 6/1982 | Bowers | |
| 5,420,541 A * | 5/1995 | Upton et al. ................ | 330/295 |
| 5,568,086 A | 10/1996 | Schuss et al. | |
| 5,739,723 A | 4/1998 | Sigmon et al. | |
| 5,757,229 A * | 5/1998 | Mitzlaff ................... | 330/124 R |
| 5,786,727 A | 7/1998 | Sigmon | |
| 5,880,633 A | 3/1999 | Leizerovich et al. | |
| 6,084,468 A | 7/2000 | Sigmon et al. | |
| 6,128,479 A | 10/2000 | Fitzpatrick et al. | |
| 6,262,629 B1 * | 7/2001 | Stengel et al. .......... | 330/124 R |
| 6,356,149 B1 * | 3/2002 | Stengel et al. .......... | 330/124 R |
| 6,374,092 B1 * | 4/2002 | Leizerovich et al. .... | 330/124 R |
| 6,396,341 B1 * | 5/2002 | Pehlke ........................ | 330/10 |
| 6,469,581 B1 * | 10/2002 | Kobayashi .................. | 330/295 |
| 6,745,046 B1 | 6/2004 | Eckert et al. | |
| 6,791,417 B1 * | 9/2004 | Pengelly et al. ............ | 330/295 |
| 6,853,245 B1 | 2/2005 | Kim et al. | |
| 2004/0174212 A1 | 9/2004 | Kim et al. | |

OTHER PUBLICATIONS

Raab, F.H., "Efficiency of Doherty RF Power-Amplifier Systems," IEEE Transactions On Broadcasting, Sep. 1987, pp. 77-83, vol. BC-33.

(Continued)

*Primary Examiner*—Khanh V. Nguyen

(57) ABSTRACT

A high linearity Doherty power amplifier integrated with output matching circuitry comprised of capacitive elements, inductive elements, and/or shunted transmission lines. In one embodiment, the output matching circuitry is implemented by transmission lines periodically shunted via capacitors, where some or all of the shunted transmission lines have lengths less than a quarter of a wavelength of a power amplifier input signal. In another embodiment, the output matching circuitry is configured with lumped inductive and capacitive elements. In addition, to improve efficiency and linearity characteristics, the power amplifier receives a voltage control signal to bias a supplemental amplifier so that the power amplifier operates in a Doherty mode in a low output power range and in a non-Doherty mode in a high output power range.

34 Claims, 22 Drawing Sheets

OTHER PUBLICATIONS

Iwamoto, M., et al., "An Extended Doherty Amplifier with High Efficiency Over a Wide Power Range," IEEE Transactions On Microwave Theory and Techniques, Dec. 2001, pp. 2472-2479, vol. 49, No. 12.

Zhao, Y., et al., "Doherty Amplifier with DSP Control to Improve Performance in CDMA Operation," 2003 IEEE MTT-S Digest, 2003, pp. 687-690, IEEE.

Lees, J., et al. "Single-Tone Optimisation of an Adaptive-Bias Doherty Structure," 2003 IEEE MTT-S Digest, 2003, pp. 2213-2216, IEEE.

Bae, S., et al., "Bias-Switching Quasi-Doherty-Type Amplifier for CDMA Handset Applications," 2003 IEEE MTT-S Digest, 2003, pp. 137-140, IEEE.

Wallace, L., "Amplifier Linearization Promotes Efficiency in Multi-Carrier WCDMA Basestation," EE Times, Oct. 18, 2002, at http://www.eetimes.com/story/OEG20021018S0059.

U.S. Appl. No. 10/737,364, Youngwoo Kwon, High Linearity Doherty Communication Amplifier with Phase Control, filed Dec. 15, 2003.

U.S. Appl. No. 10/690,923, Youngwoo Kwon, High Linearity Doherty Communication Amplifier with Bias Control, filed Oct. 21, 2003.

U.S. Appl. No. 10/432,553, Youngwoo Kwon, Power Amplification Apparatus of Portable Terminal, filed May 21, 2003.

* cited by examiner

HIGH LINEARITY DOHERTY COMMUNICATION AMPLIFIER WITH INTEGRATED OUTPUT MATCHING UNIT

RELATED APPLICATIONS

This application is a continuation-in-part application of U.S. patent application Ser. No. 10/432,553 filed on Apr. 26, 2004 entitled "Power Amplification Apparatus of Portable Terminal," which is a National Stage application for and claims priority to International Application No. PCT/KR02/00163, filed Feb. 4, 2002, which claims priority to Korean Utility Patent Application No. 2002-5924, filed on Feb. 1, 2002, all of which are incorporated by reference herein for all purposes. The present invention is also related to U.S. patent application Ser. No. 10/690,923 entitled "High Linearity Doherty Communication Amplifier with Bias Control" filed Oct. 21, 2003, and U.S. patent application Ser. No. 10/737,364 entitled "High Linearity Doherty Communication Amplifier with Phase Control" filed Dec. 15, 2003.

TECHNICAL FIELD

The invention relates to a power amplification circuit for use in wireless communication technologies, and more particularly to a power amplification circuit in a mobile handset.

BACKGROUND ART

As mobile handsets used for wireless communication services are becoming smaller and lighter, battery size is also decreasing. Consequently, the effective talk time (i.e., transmission time) of mobile computing devices, mobile phones, and the like (i.e., handsets) is reduced.

In a conventional mobile handset, the Radio Frequency (RF) power amplifier consumes most of the power consumed in contrast to the overall system of the mobile handset. Thus, the RF power amplifier having a low efficiency typically results in degradation of the efficiency for the overall system, and accordingly reduces the talk time.

For this reason, much effort has been concentrated on increasing efficiency of the RF power amplifier. In one approach, a Doherty-type power amplifier has been introduced recently as a circuit for increasing efficiency of the RF power amplifier. Unlike other conventional power amplifiers, whose efficiency is low over the low output power range, the Doherty-type power amplifier is designed to maintain an optimum efficiency over a wide output power range (e.g., in low, intermediate, and high output power ranges). However, typical Doherty-type power amplifiers include phase delay circuitry and output matching circuitry comprised of bulky, space-consuming transmission lines.

A common Doherty-type power amplifier design also includes a carrier amplifier and a peak amplifier. The carrier amplifier (i.e., power or main amplifier), which is composed of relatively small transistors, operates to maintain the optimal efficiency up to a certain low output power level. The peak amplifier (i.e., supplemental or auxiliary amplifier) operates in cooperative fashion with the carrier amplifier to maintain a high efficiency until the power amplifier, as a whole, produces a maximum output power. When the power amplifier operates within a low power output range, only the carrier amplifier is operational; the peak amplifier, being biased as a class B or C, does not operate. But, when the power amplifier operates within a high output power range, the peak amplifier is active and may introduce nonlinearity into the overall power amplifier since the peak amplifier is biased as a highly nonlinear class B or class C amplifier.

Theoretically, the above-mentioned Doherty-type power amplifier is designed to operate while meeting the linearity specification over an entire output power range and where high efficiency is maintained. However, as described above, because the Doherty-type power amplifier comprises a carrier amplifier and a peak amplifier that operate with each other, the Doherty-type power amplifier in practice does not satisfy the linearity specification (e.g., in terms of phase or amplitude of gain characteristics) over the entire output power range where high efficiency is maintained.

In summary, in the above-mentioned Doherty-type power amplifier in the related art, the linearity characteristics of such a power amplification device are difficult to predict, which makes it difficult to improve such linearity characteristics because the peak amplifier is biased at a relatively constant, low DC current level, such as a current to set the peak amplifier as a class B or C amplifier. In addition, typical Doherty-type power amplifiers of the related art comprise bulky transmission line circuitry that may impede integration of the power amplifier into mobile handsets, unless size issues associated with power amplifier design are further addressed.

BRIEF SUMMARY OF THE INVENTION

There is a need to overcome the drawbacks of the prior art and to provide at least the advantages described hereinafter. In order to solve the above problems pertaining to the previous technology, a specific embodiment of the invention provides a high linearity Doherty power amplifier with integration of power amplifier components within a space-constrained mobile handset using combinations of passive, active, and shunted transmission line components.

The power amplifier in a mobile handset, according to one embodiment of the invention, comprises a carrier amplifier having a carrier input terminal and a carrier output terminal; a peak amplifier having a peak input terminal, a peak output terminal and a control terminal for receiving a voltage control signal; a phase shifter coupled to the carrier input terminal and the peak input terminal for generating a peak amplifier input signal delayed in phase from a carrier amplifier input signal; and an output matching unit comprising a first $\lambda/4$ transformer for providing an inverted impedance at the carrier output terminal and a second $\lambda/4$ transformer for matching an output impedance of the power amplifier to a reference impedance. Furthermore, in order to provide efficient linear signal processing, the peak amplifier includes a voltage control unit configured to receive the voltage control signal and bias the peak amplifier in accordance with the required output power levels of signals.

In one embodiment of the invention, the first $\lambda/4$ transformer is a first shunted transmission line unit including at least one transmission line having a length less than a quarter of a wavelength of an input signal to the power amplifier. In another embodiment of the invention, the second $\lambda/4$ transformer is a second shunted transmission line unit including at least one transmission line having a length less than a quarter of a wavelength of the input signal to the power amplifier. Yet in a further embodiment of the invention, the first and second $\lambda/4$ transformers comprise lumped inductive and capacitive elements.

In another embodiment of the invention, the phase shifter is an active phase shifter that comprises a lower differential unit coupled to an input stage and the peak input terminal for generating the peak amplifier input signal; an upper differential unit coupled to the input stage and the carrier input terminal for generating the carrier amplifier input signal; and a phase control unit coupled to the input stage and the upper differential unit for tuning a phase difference between the peak amplifier input signal and the carrier amplifier input signal within a phase tolerance. In a further embodiment of the invention, the phase shifter is a passive phase shifter comprised of capacitive and inductive lumped elements.

In another embodiment of the invention, a baseband modem chipset generates the voltage control signal according to power levels of signals received from the base station. Specifically, in a low output power range, a control voltage in a first state is applied to the peak amplifier so that the power amplifier is operated in a Doherty mode and, in the high output power range, a control voltage in a second state is applied to the peak amplifier so as to sufficiently manage non-linearity characteristics of the power amplifier.

DETAILED DESCRIPTION OF SPECIFIC EMBODIMENTS

Hereinafter, a detailed description will be given with reference to the attached drawings as to an exemplary power amplifier in a mobile handset in accordance with various embodiments of the invention.

Figure 1:
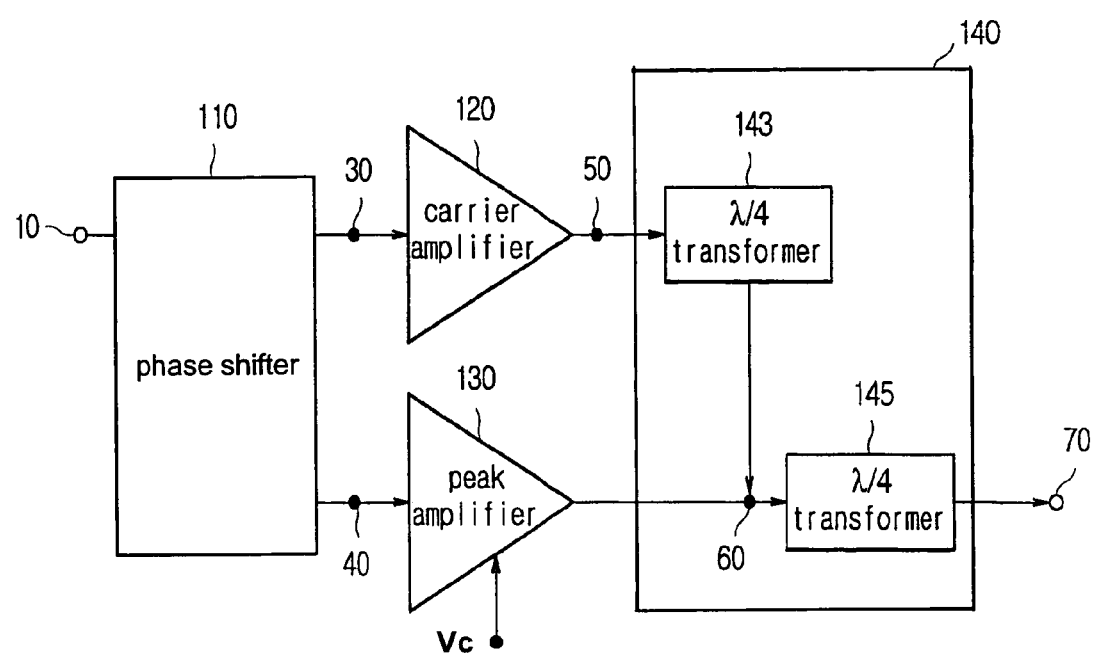
FIG. 1 is a block diagram showing the structure of a power amplifier in a mobile handset in accordance with one embodiment of the invention.

FIG. 1 illustrates an exemplary power amplifier 100 in a mobile handset in accordance with a specific embodiment of the invention. Power amplifier 100 comprises a phase shifter 110, a carrier amplifier 120, a peak amplifier 130, and an output matching unit 140. Phase shifter 110 distributes certain input powers to carrier amplifier 120 and peak amplifier 130, minimizes interference between carrier amplifier 120 and peak amplifier 130 and transmits signals in such a manner that the phase of input signal of peak amplifier 130 is 90° (λ/4) delayed from the phase of input signal of carrier amplifier 120. Accordingly, phase shifter 110 compensates for a later processing of output signals from carrier amplifier 120 and peak amplifier 130 by output matching unit 140 by generating a 90° (λ/4) phase delay at the output matching unit 140 between the phases of output signals from carrier amplifier 120 and peak amplifier 130. Thus, phase shifter 110's introduction of phase difference between the phases of output signals from carrier amplifier 120 and peak amplifier 130 to compensate for subsequent processing of the output signals by the output matching unit 140 results in an equalization of the phases of the output signals and an optimum output power signal at an output stage 70. Phase shifter 110 is discussed further below in conjunction with FIGS. 2A–2E.

Carrier amplifier 120 amplifies signals received from phase shifter 110. In one example, carrier amplifier 120 includes a transistor that can be sized smaller than that of a transistor constituting peak amplifier 130. The ratio of these respective transistor sizes, in part, determines an output power range over which an optimum efficiency can be maintained. The higher this ratio, the wider the output power range over which the optimum efficiency can be maintained. One having ordinary skill in the art should appreciate that each amplifier can include one or more transistors or other like circuit elements. Further, that the ordinarily skilled artisan should recognize that carrier amplifier 120 and peak amplifier 130 can be implemented in any known semiconductor technologies, such as Si LDMOS, GaAS MESFET, GaAs pHEMT, GaAs HBT, or the like. Carrier amplifier 120 is discussed further below in conjunction with FIGS. 3A–3E.

Peak amplifier 130, which is another amplifier for amplifying signals received from phase shifter 110, is not substantially operated while low-level input signals are applied to carrier amplifier 120. This is made possible by applying a voltage control signal Vc to peak amplifier 130 such that peak amplifier 130 is biased as a class B or C amplifier, where little or no DC current flows. Over the low output power range where peak amplifier 130 is not substantially operated, carrier amplifier 120 has an output impedance having a relatively constant and high value. Since peak amplifier 130 does not draw any current, power amplifier 100 can obtain improved efficiency at an output power level which is lower than the highest output power level that carrier amplifier 120 can generate.

Peak amplifier 130 is configured to receive the voltage control signal Vc from a baseband modem chipset (not shown) or from power amplifier RF processing circuitry (not shown). The baseband modem chipset generates the voltage control signal Vc based upon power levels of signals received from a base station (not shown). The power amplifier RF processing circuitry processes signals from the baseband modem chipset, and is well know to one skilled in the art. Peak amplifier 130 is discussed further below in conjunction with FIGS. 4A–4D.

Output matching unit 140 includes a first λ/4 transformer 143. First λ/4 transformer 143 operates as an impedance inverter and is used to provide an impedance at a carrier amplifier output terminal 50 that is inverted from an impedance at a peak amplifier output terminal 60. A second λ/4 transformer 145 at the peak amplifier output terminal 60 of the peak amplifier 130 matches an output impedance of the power amplifier 100 to a reference characteristic impedance which is typically 50 ohms. First λ/4 transformer 143 and second λ/4 transformer 145 may be formed as two integrated circuits, a single integrated circuit, or a hybrid circuit comprising integrated elements and lumped elements. In addition, first λ/4 transformer 143 and second λ/4 transformer 145 may be implemented by either the LTCC (Low Temperature Co-Fired Ceramic) method or a multi-layer method. Output matching unit 140 is discussed further below in conjunction with FIGS. 5–7.

Figure 2A:
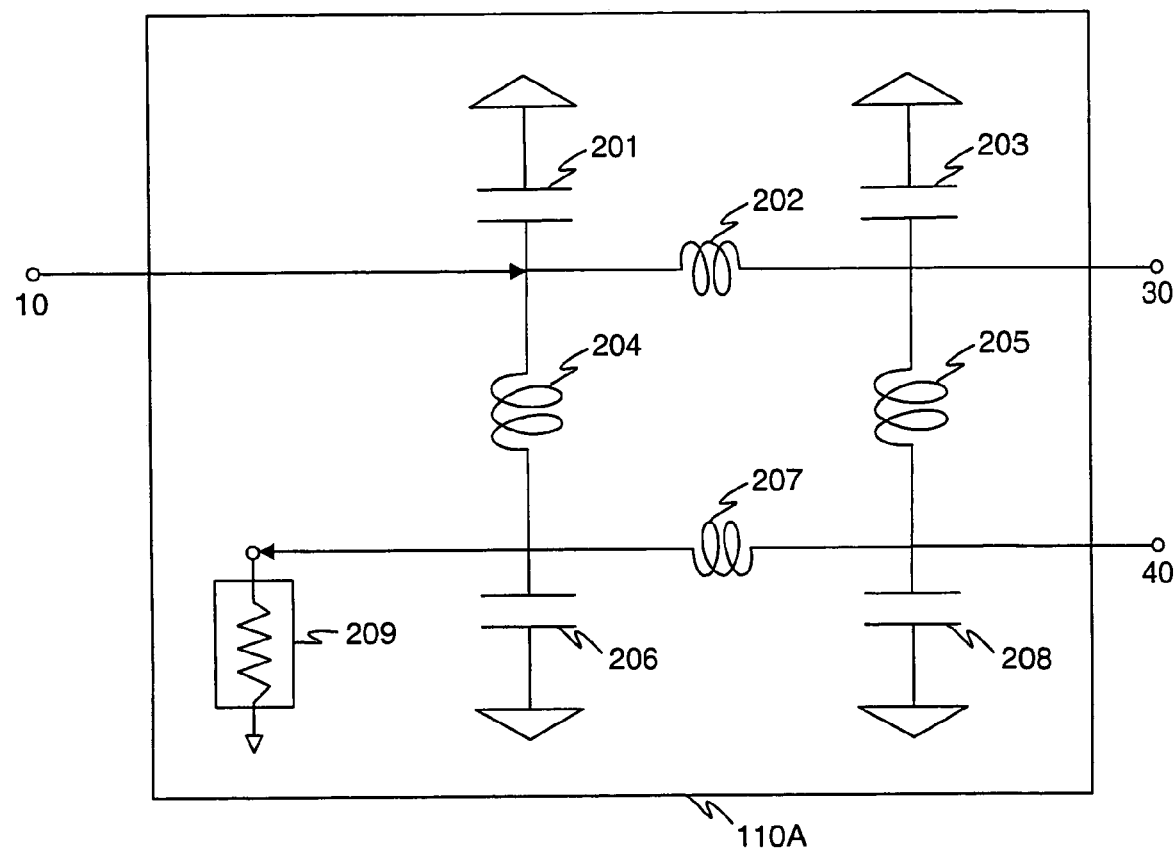
FIG. 2A illustrates one embodiment of phase shifter illustrated in FIG. 1, in accordance with the invention.

FIG. 2A illustrates a passive phase shifter 110A comprised of lumped elements, in accordance with one embodiment of the invention. Passive phase shifter 110A comprises a capacitor 201, an inductor 202, a capacitor 203, an inductor 204, an inductor 205, a capacitor 206, an inductor 207, a capacitor 208, and a termination resistor 209. At an operating frequency of approximately 1.8 GHz, for example, nominal capacitances of capacitors 201, 203, 206, and 208 are a few pico-Farads (e.g., 1–10 pF typically), and nominal inductances of inductors 202, 204, 205, and 207 are a few nano-Henries (e.g., 1–10 nH typically). Elements 201, 202, 203, 204, 205, 206, 207, 208, and 209 are collectively referred to as "lumped elements" of phase shifter 11A. Signals are received by an input stage 10 of passive phase shifter 11A, which has a signal coupling of about 3 dB or more, and transmitted to carrier amplifier input terminal 30 (FIG. 1) and peak amplifier input terminal 40 (FIG. 1). Passive phase shifter 110A processes the signals received at input stage 10 such that a signal at carrier amplifier input terminal 30 and a signal at peak amplifier input terminal 40 have a phase difference at or about 90° (λ/4, or quarter-wave).

In one embodiment, passive phase shifter 110A may be implemented using a Microwave Monolithic Integrated Circuit (MMIC) chip technology, such as GaAs or any other known semiconductor technologies. That is, passive phase shifter 110A may be fabricated as an integrated circuit, which can be packaged as a single power amplifier device or chip. In another embodiment, passive phase shifter 110A may be implemented by a Low Temperature Co-fired Ceramic (LTCC) method or other similar technologies.

Figure 2B:
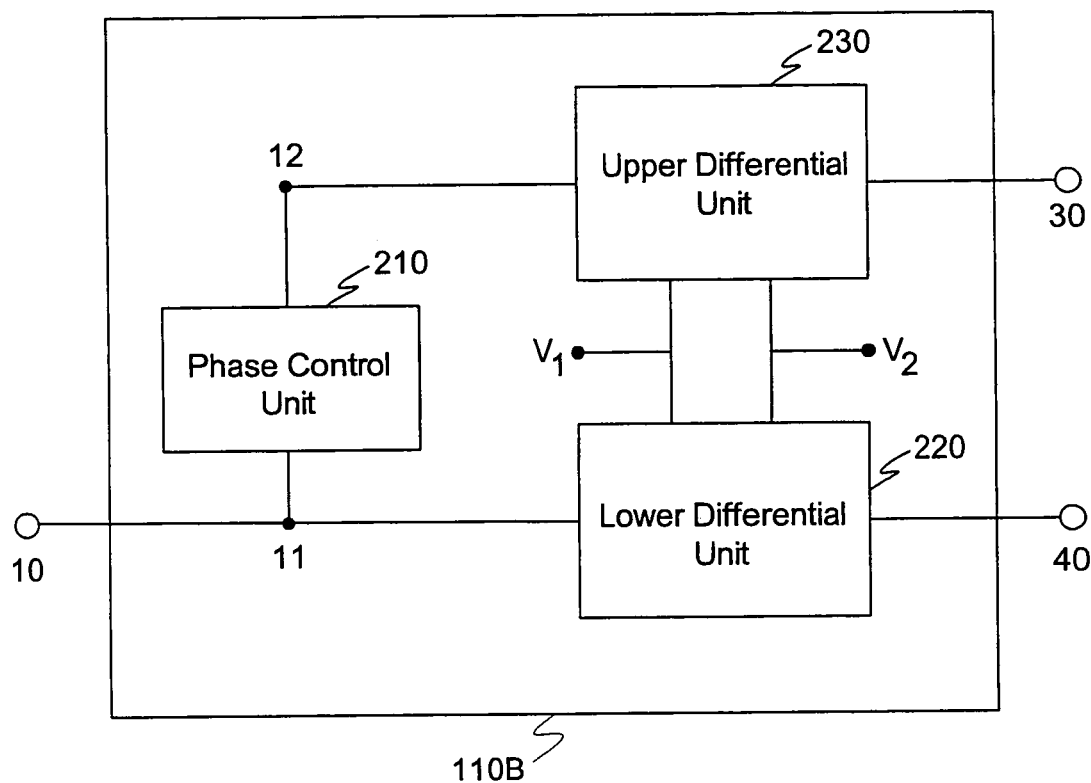
FIG. 2B illustrates another embodiment of phase shifter illustrated in FIG. 1, according to the invention.

FIG. 2B illustrates an active phase shifter 110B, according to one embodiment of the invention. Active phase shifter 110B includes a phase control unit 210, a lower differential unit 220, and an upper differential unit 230. As discussed further below in conjunction with FIGS. 2D–2E, upper differential unit 230 and lower differential unit 220 are comprised of active components. Typically, since active components such as transistors occupy less chip area than passive components such as transmission lines, mobile handset circuit designers may advantageously implement active phase shifter 110B on a size-constrained power amplifier integrated circuit chip or mobile handset integrated circuit die. A typical mobile handset integrated circuit die is 4 mm by 4 mm, although 3 mm by 3 mm circuit dies will be manufactured in the future.

In operation, lower differential unit 220 receives a signal from input stage 10 and upper differential unit 230 receives a signal from phase control unit 210. Lower differential unit 220 and upper differential unit 230 process and transmit the signals such that a phase difference of approximately 90° is generated between a signal at carrier amplifier input terminal 30 and a signal at peak amplifier input terminal 40. However, since the active components of upper differential unit 230 and lower differential unit 220 typically generate parasitic impedances dependent upon signal frequency and signal power, the phase difference between signals at carrier amplifier input terminal 30 and peak amplifier input terminal 40 may drift and/or may not be within a specified phase tolerance. In one embodiment of the invention, the active phase shifter 110B generates signals at carrier amplifier input terminal 30 and peak amplifier input terminal 40 with a phase difference of 90° within a phase tolerance of 5%. That is, a phase difference Φ is within a range 85.5°≦Φ≦94.5°. Phase control unit 210 provides phase difference stability and maintains the phase difference Φ within the specified phase tolerance. Active phase shifter 110B may generate other phase differences maintained within other phase tolerances, and various combinations of the other phase differences with the other phase tolerances are within the scope of the invention.

As illustrated in FIG. 2B, phase control unit 210 is coupled between input stage 10 and upper differential unit 230. Phase control unit 210 is configured to fine tune phase differences between signals at carrier amplifier input terminal 30 and peak amplifier input terminal 40 for variations in input signal power and input signal frequency, and to maintain the phase differences within specified phase tolerances. Phase control unit 210 is discussed further below in conjunction with FIG. 2C.

Figure 2C:
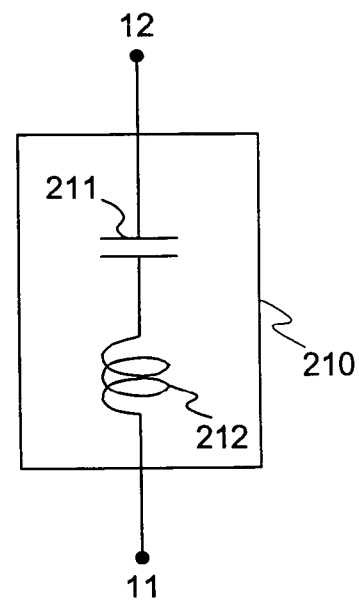
FIG. 2C illustrates phase control unit illustrated in FIG. 2B, according to one embodiment of the invention.

FIG. 2C illustrates phase control unit 210 of FIG. 2B, according to one embodiment of the invention. Phase control unit 210 includes a capacitor 211 and an inductor 212. At an operating frequency of approximately 1.8 GHz, for example, capacitor 211 may have a nominal capacitance of a few pico-Farads (pF), and inductor 212 may have a nominal inductance of a few nano-Henries (nH). However, phase control unit 210 may be implemented with any combination of capacitances and inductances to generate predetermined resonance frequencies. In one embodiment of the invention, phase control unit 210 is integrated with upper differential unit 230 and lower differential unit 220 onto a single chip (i.e., phase control unit 210 is on-chip). In another embodiment of the invention, phase control unit 210 is implemented as an off-chip unit. In yet a further embodiment, capacitor 211 may be implemented as two or more parallel capacitors, where one or more of the parallel capacitors are implemented as off-chip capacitors electrically coupled to the on-chip capacitors. Any of these embodiments of phase control unit 210 may be implemented either as discrete devices, integrated circuits, hybrid circuits, or the like.

In one embodiment of the invention, phase control unit 210 is tuned during a design stage of power amplifier 100 for a given specification of input signal power, input signal frequency, and phase tolerance. Alternatively, a user may tune phase control unit 210 by varying a capacitance of capacitor 211. For example, phase control unit 210 may be programmable tuned or electrically tuned, for example, by switching in various off-chip capacitors (not shown) that electrically couple to capacitor 211, or by adjusting a capacitance of an off-chip varactor (not shown) electrically coupled to capacitor 211. Optionally, a retailer or a user may selectively adjust the capacitance of capacitor 211 by laser trimming capacitor 211, or application of other similar techniques known in the art.

Figure 2D:
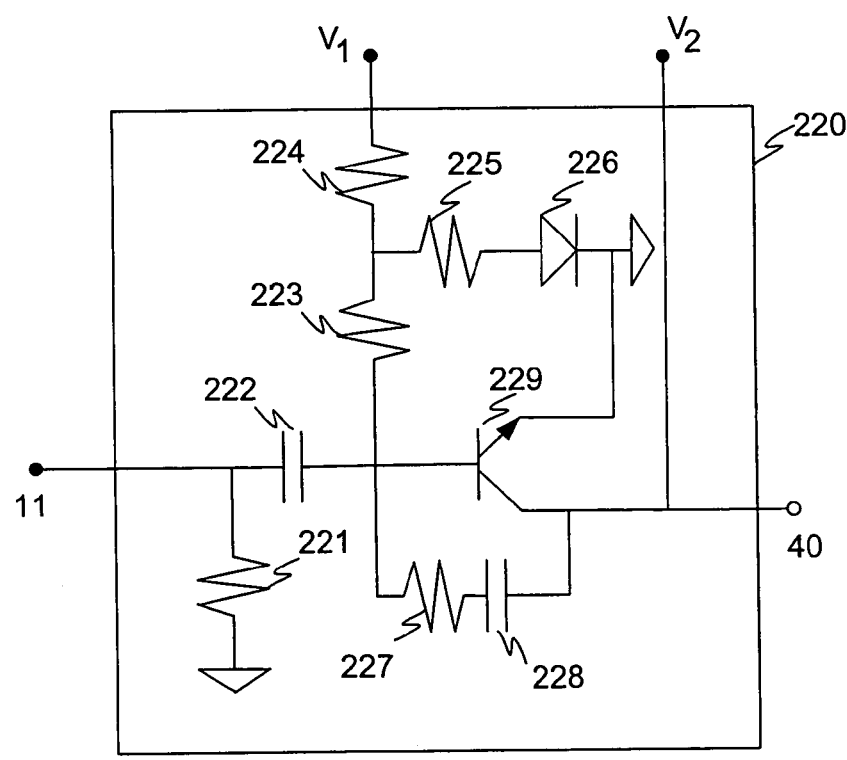
FIG. 2D illustrates lower differential unit illustrated in FIG. 2B, according to one embodiment of the invention.

FIG. 2D illustrates lower differential unit 220 of FIG. 2B, according to one embodiment of the invention. Lower differential unit 220 includes a resistor 221, a capacitor 222, a resistor 223, a resistor 224, a resistor 225, a diode 226, a resistor 227, a capacitor 228, and a bipolar transistor $Q_{CE}$ 229 configured as a common-emitter transistor, collectively referred to as lower differential electrical components. Resistors 221 and 223 may have resistances of several hundred Ohms, resistors 224 and 227 may have resistances of a few kilo-Ohms, resistor 225 may have a resistance of a few tens of Ohms or less, and capacitors 222 and 228 may have capacitances of a few pico-Farads. According to the invention, the common-emitter bipolar transistor $Q_{CE}$ 229 may be implemented by various common-emitter bipolar transistor size configurations. In one embodiment of the invention, a $Q_{CE}$ 229:Q11 345 (FIG. 3D) transistor size ratio may be approximately in a range of 1:2 to 1:12. A DC voltage V1 biases a base terminal of transistor $Q_{CE}$ 229, and a DC voltage V2 biases a collector terminal of transistor $Q_{CE}$ 229. In an exemplary embodiment of the invention, V1=2.8V and V2=3.4V, although the scope of the invention covers other bias voltages in accordance with electrical characteristics and operating frequencies of power amplifier 100. In yet another embodiment of the invention, the common-emitter bipolar transistor $Q_{CE}$ 229 may be replaced with a common-source field effect transistor (not shown).

Figure 2E:
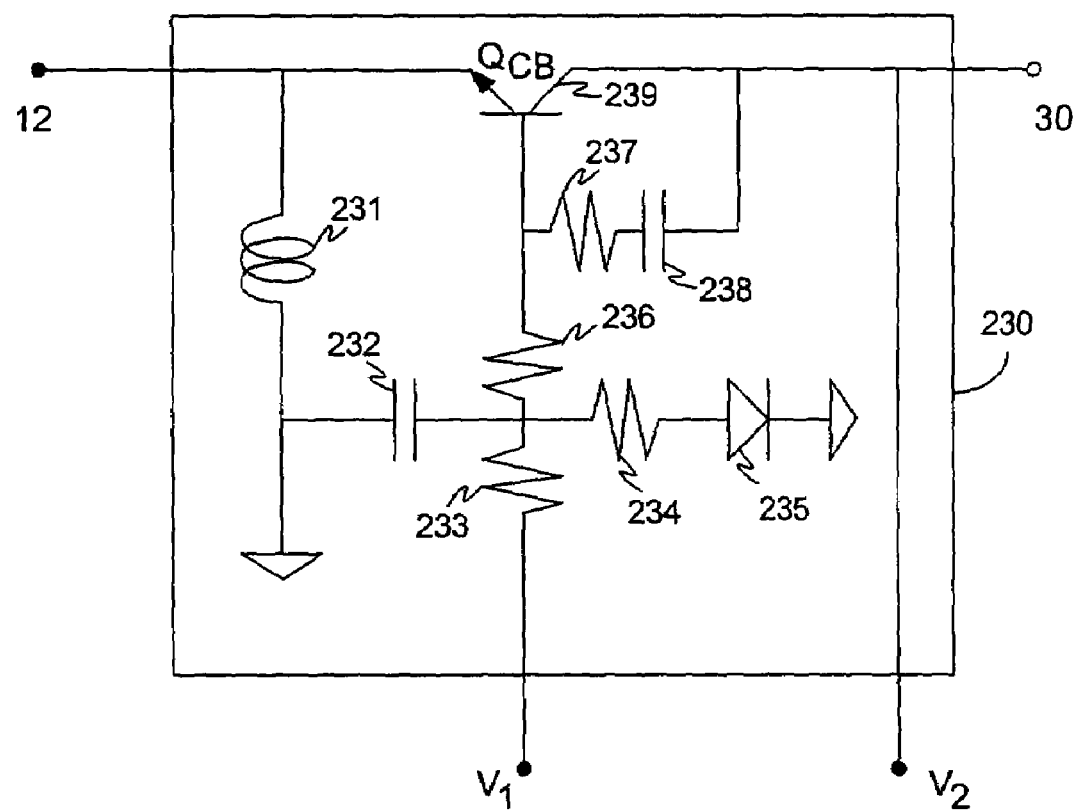
FIG. 2E illustrates upper differential unit illustrated in FIG. 2B, according to one embodiment of the invention.

FIG. 2E illustrates upper differential unit 230 of FIG. 2B, according to one embodiment of the invention. Upper differential unit 230 includes an inductor 231, a capacitor 232, a resistor 233, a resistor 234, a diode 235, a resistor 236, a resistor 237, a capacitor 238, and a bipolar transistor $Q_{CB}$ 239 configured as a common-base transistor, collectively referred to as "upper differential electrical components." Resistors 236 and 237 may have resistances of several hundred Ohms, resistor 233 may have resistance of a few kilo-Ohms, resistor 234 may have a resistance of a few tens of Ohms or less, capacitors 232 and 238 may have capacitances of a few pico-Farads or less, and inductor 231 may have an inductance of a few tens of nano-Henries. According to the invention, the common-base bipolar transistor $Q_{CB}$ 239 may be implemented by various common-base bipolar transistor size configurations. In one embodiment of the invention, a $Q_{CB}$ 239:Q11 345 (FIG. 3D) transistor size ratio may be approximately in a range of 1:2 to 1:12. The DC voltage V1 biases a base terminal of transistor $Q_{CB}$ 239, and the DC voltage V2 biases a collector terminal of transistor $Q_{CB}$ 239. In an exemplary embodiment of the invention, V1=2.8V and V2=3.4V, although the scope of the invention covers other bias voltages in accordance with electrical characteristics and operating frequencies of power amplifier 100. In yet another embodiment of the invention, the common-base bipolar transistor $Q_{CB}$ 239 may be replaced with a common-gate field effect transistor (not shown).

Electrical characteristics of the lower differential electrical components and the upper differential electrical components are selected in conjunction with the DC bias voltages V1 and V2 to generate signals at carrier amplifier input terminal 30 (FIG. 2E) and peak amplifier input terminal 40 (FIG. 2D) with a phase difference of 90°, and to distribute input signal powers to peak amplifier 130 (FIG. 1) and carrier amplifier 120 (FIG. 1).

Referring back to FIG. 2B, active phase shifter 110B is configured to provide a required phase difference (also referred to as a phase delay) between signals at carrier amplifier input terminal 30 and peak amplifier input terminal 40 within a specified phase tolerance, and offset parasitic impedances inherent in active elements of the upper differential electrical components and the lower differential electrical components. That is, active phase shifter 110B compensates for a later processing of output powers from carrier amplifier 120 (FIG. 1) and peak amplifier 130 (FIG. 1) by output matching unit 140 (FIG. 1) by generating a 90° (λ/4) phase delay at the output matching unit 140 between the phases of output signals from carrier amplifier 120 and peak amplifier 130.

Figure 3A:
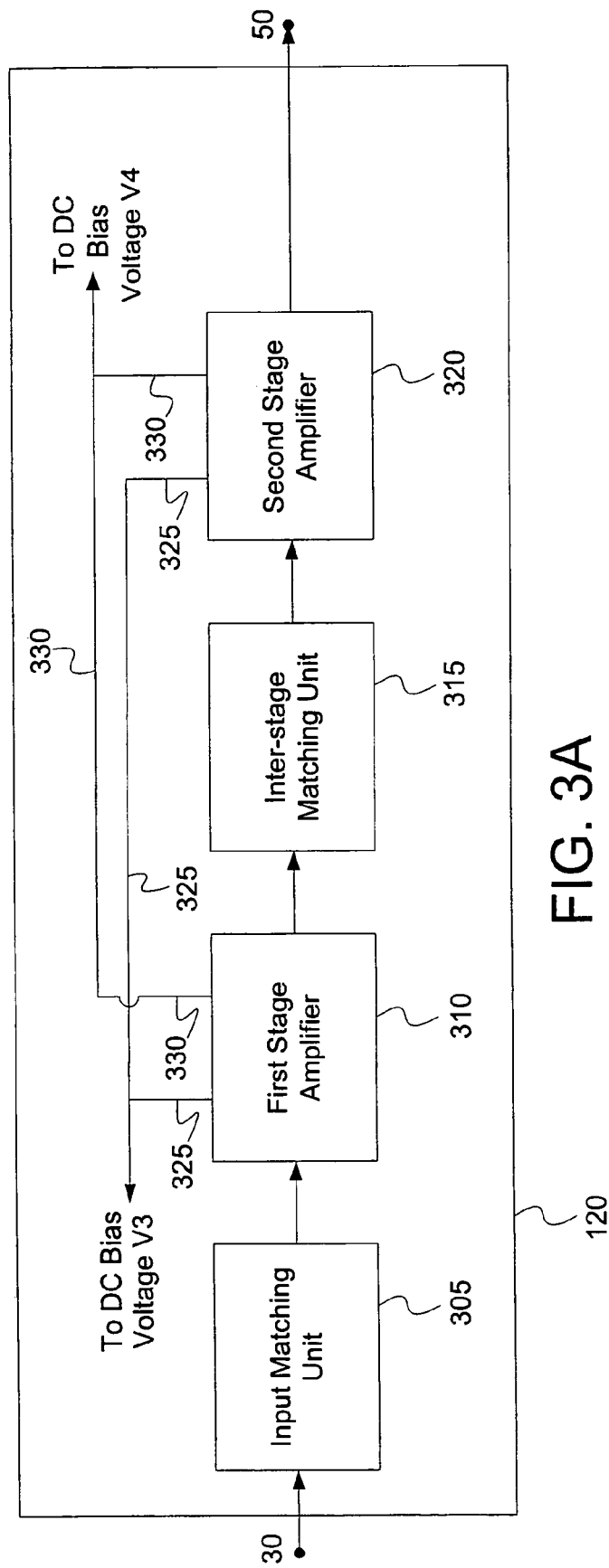
FIG. 3A is a block diagram of the carrier amplifier illustrated in FIG. 1, according to one embodiment of the invention.

FIG. 3A is a block diagram of carrier amplifier 120 illustrated in FIG. 1, according to one embodiment of the invention. In the FIG. 3A embodiment of the invention, carrier amplifier 120 is a two-stage amplifier and includes an input matching unit 305, a first stage amplifier 310, an inter-stage matching unit 315 and a second stage amplifier 320. The input matching unit 305 matches an output impedance of 3 dB hybrid coupler 110 with an input impedance of carrier amplifier 120. Similarly, the inter-stage matching unit 315 matches an output impedance of first stage amplifier 310 with an input impedance of second stage amplifier 320. Input matching unit 305 and inter-stage matching unit 315 are discussed further below in conjunction with FIGS. 3B and 3C, respectively.

In addition, carrier amplifier 120 includes conductor lines 325 electrically coupled to a DC bias voltage V3 (not shown) and conductor lines 330 electrically coupled to a DC bias voltage V4 (not shown) for biasing first stage amplifier 310 and second stage amplifier 320. In an exemplary embodiment of the invention, V3=2.85V and 3.2V<V4<4.2V, although the scope of the invention covers other bias voltages in accordance with operating characteristics of first stage amplifier 310 and second stage amplifier 320.

Figure 3B:
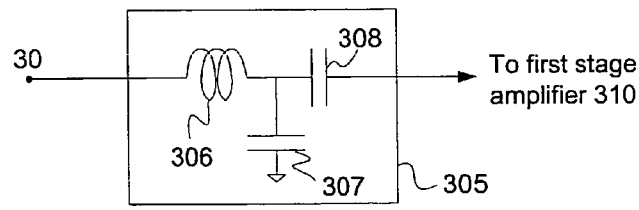
FIG. 3B is a block diagram of the input matching unit illustrated in FIG. 3A, according to one embodiment of the invention.

FIG. 3B is a block diagram of input matching unit 305 illustrated in FIG. 3A, according to one embodiment of the invention. Input matching unit 305 includes an inductor 306, a capacitor 307 and a capacitor 308. Inductor 306 electrically couples 3 dB hybrid coupler 110 (FIG. 1) with capacitor 307 and capacitor 308. Additionally, capacitor 307 is electrically coupled to ground, and capacitor 308 is electrically coupled to first stage amplifier 310 (FIG. 3A). In one embodiment of the invention, electrical characteristics of inductor 306, capacitor 307, and capacitor 308 are selected such that an output impedance of 3 dB hybrid coupler 110 is matched to an input impedance of carrier amplifier 120 (FIG. 3A), measured at a terminal 30. For example, capacitances of capacitors 307 and 308 are nominally a few pico-Farads, and inductor 306 has a nominal inductance of a few nano-Henries.

Figure 3C:
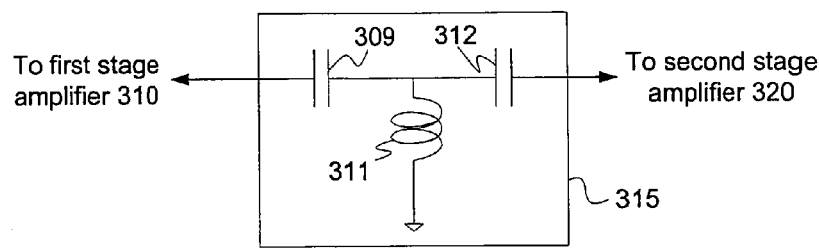
FIG. 3C is a block diagram of the inter-stage matching unit illustrated in FIG. 3A, according to the invention.

FIG. 3C is a block diagram of inter-stage matching unit 315 illustrated in FIG. 3A, according to the invention. Inter-stage matching unit 315 includes a capacitor 309, an inductor 311 and a capacitor 312. Capacitor 309 electrically couples a signal received from first stage amplifier 310 (FIG. 3A) with inductor 311 and capacitor 312. Furthermore, inductor 311 is electrically coupled to ground, and capacitor 312 is electrically coupled to second stage amplifier 320 (FIG. 3A). In one embodiment of the invention, electrical characteristics of capacitor 309, inductor 311, and capacitor 312 are selected such that an output impedance of first stage amplifier 310 (FIG. 3A) is matched to an input impedance of second stage amplifier 320 (FIG. 3A). For example, capacitances of capacitors 309 and 312 are nominally a few pico-Farads, and inductor 311 has a nominal inductance of a few nano-Henries.

Figure 3D:
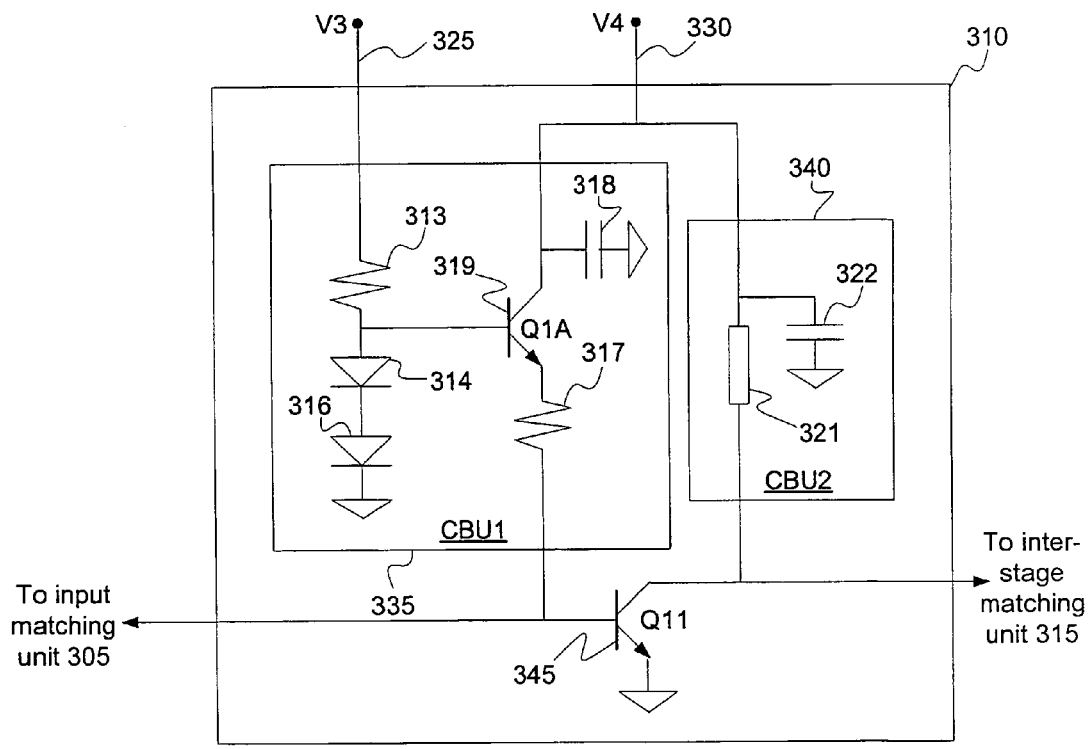
FIG. 3D is a block diagram of the first stage amplifier illustrated in FIG. 3A, in accordance with one embodiment of the invention.

FIG. 3D is a block diagram of first stage amplifier 310 illustrated in FIG. 3A, in accordance with one embodiment of the invention. First stage amplifier 310 includes a conventional bias unit 1 (CBU1) 335, a conventional bias unit 2 (CBU2) 340 and a transistor Q11 345. In the FIG. 3D exemplary embodiment of the invention, transistor Q11 345 is configured as a common-emitter npn bipolar transistor. CBU1 335 includes a resistor 313, a diode 314, a diode 316, a resistor 317, a capacitor 318, and a transistor Q1A 319. CBU2 340 includes a transmission line 321 and a capacitor 322. As known to one in the art, electrical characteristics of resistor 313, diode 314, diode 316, resistor 317, capacitor 318, and transistor Q1A 319, collectively referred to as first stage base bias elements for descriptive purposes, are selected in conjunction with DC bias voltages V3 and V4 to bias a base of transistor Q11 345 for normal mode of operation. For example, resistor 313 may have a resistance in a range of several hundred Ohms to several kilo-Ohms, resistor 317 may have a resistance in a range of several Ohms to several hundred Ohms, and a Q1A:Q11 transistor size ratio may be approximately in a range of 1:4 to 1:10. Similarly, electrical characteristics of transmission line 321 and capacitor 322, collectively referred to as first stage collector bias elements for descriptive purposes, are selected in conjunction with bias voltage V4 to bias a collector of transistor Q11 345 for normal mode of operation. For example, electrical characteristics of the first stage base bias elements are selected to specify a base-emitter current $I_{BE}$ (not shown) of transistor Q11 345 and electrical characteristics of the first stage collector bias elements are selected to specify a collector-emitter voltage $V_{CE}$ (not shown) of transistor Q11 345, thus allowing transistor Q11 345 to operate within a normal mode of operation and with a predefined amplification factor.

Figure 3E:
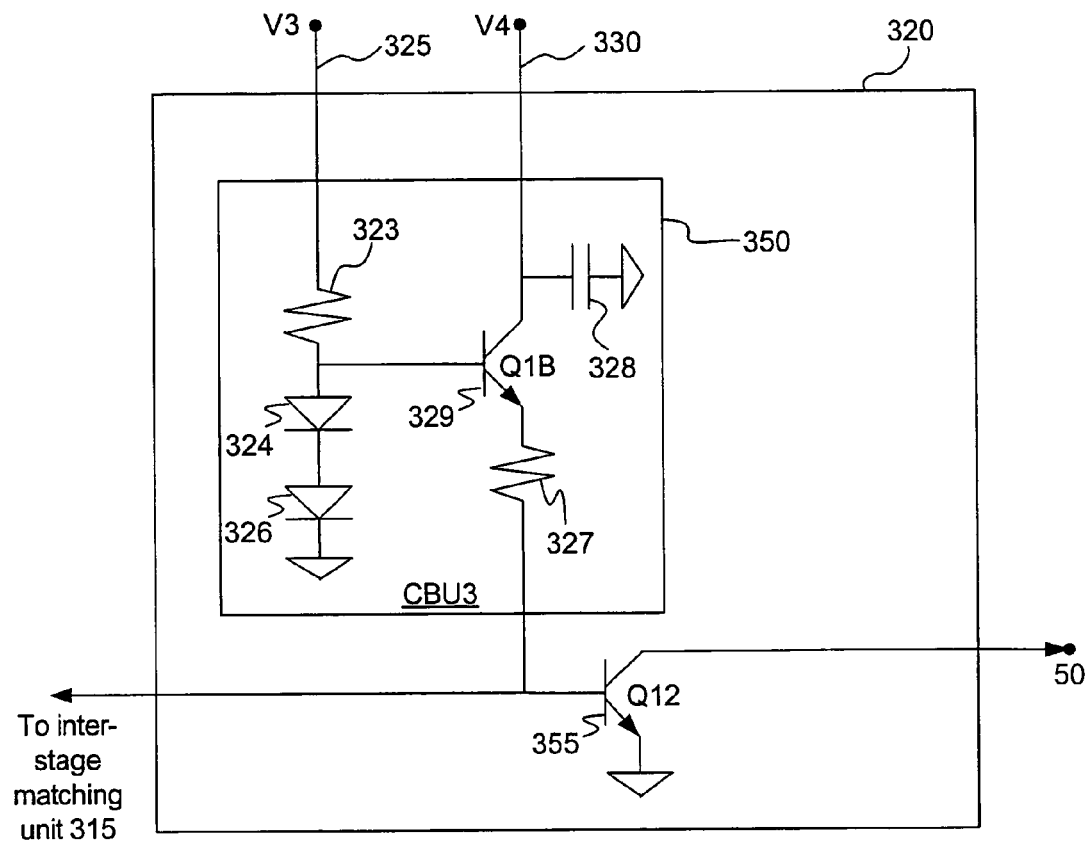
FIG. 3E is a block diagram of the second stage amplifier illustrated in FIG. 3A, according to one embodiment of the invention.

FIG. 3E is a block diagram of second stage amplifier 320 illustrated in FIG. 3A, according to one embodiment of the invention. Second stage amplifier 320 includes a conventional bias unit 3 (CBU3) 350 and a transistor Q12 355. CBU3 350 includes a resistor 323, a diode 324, a diode 326, a resistor 327, a capacitor 328, and a transistor Q1B 329, collectively referred to as second stage base bias elements. In the FIG. 3E embodiment of the invention, coupling of the second stage base bias elements of CBU3 350 is identical to coupling of the first stage base bias elements of CBU1 335 (FIG. 3D). However, electrical characteristics of the second stage base bias elements may or may not be identical to electrical characteristics of the first stage base bias elements. For example, resistor 313 (FIG. 3D) and resistor 323 may have different resistance values, and transistor Q1A 319 (FIG. 3D) and transistor Q1B 329 may be of different sizes. In operation, electrical characteristics of resistor 323, diode 324, diode 326, resistor 327, capacitor 328, and transistor Q1B 329 are selected in conjunction with DC bias voltages V3 and V4 to bias a base of transistor Q12 355 for normal-mode operation, based upon operating characteristics of transistor Q12 355 and specifications of power amplifier 100 (FIG. 1). For example, resistor 323 may have a resistance in a range of several hundred Ohms to several kilo-Ohms, resistor 327 may have a resistance in a range of several Ohms to several hundred Ohms, a Q1B:Q12 transistor size ratio may be approximately in a range of 1:4 to 1:10, and a Q11:Q12 transistor size ratio may be approximately in a range of 1:4 to 1:8. However, the scope of the present invention covers other transistor size ratios that are within operating specifications of carrier amplifier 120 (FIG. 1) and power amplifier 100 (FIG. 1). In the FIG. 3E exemplary embodiment of the invention, transistor Q12 355 is configured as a common-emitter npn bipolar transistor.

Figure 4A:
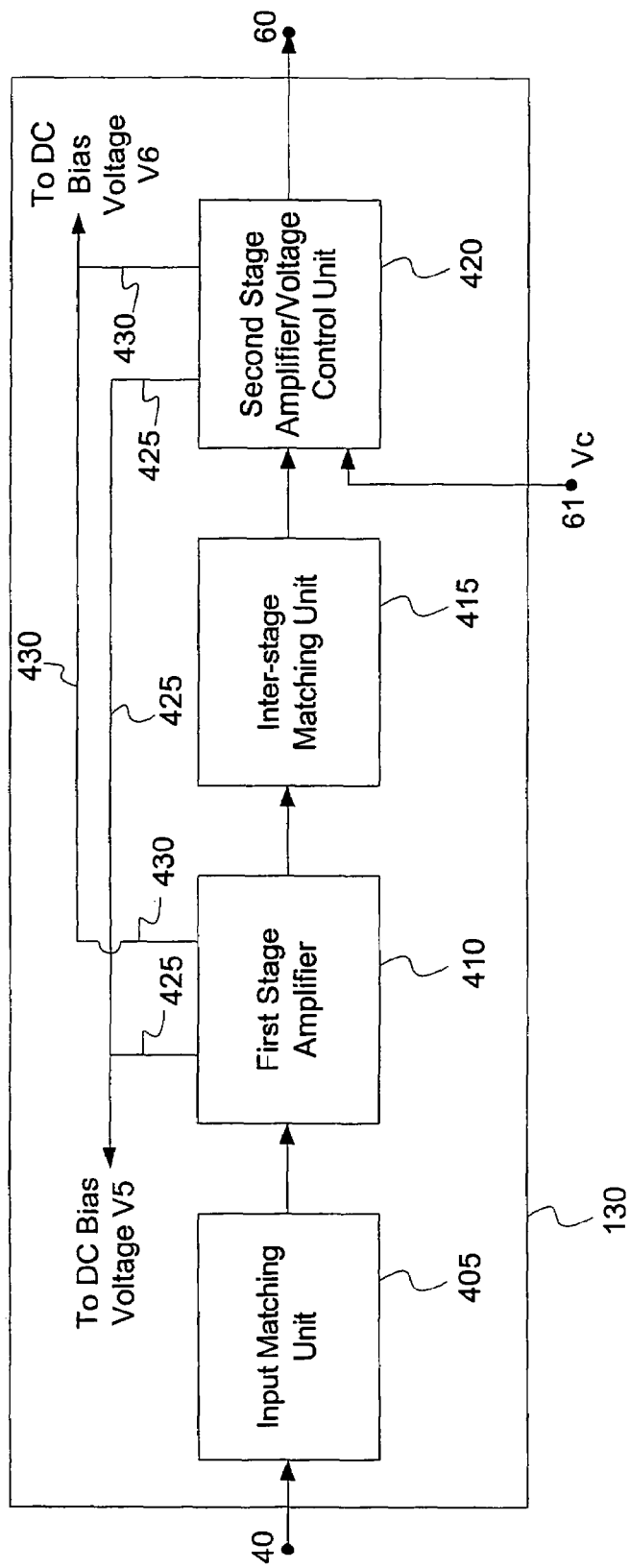
FIG. 4A is a block diagram of the peak amplifier illustrated in FIG. 1, according to one embodiment of the invention.

FIG. 4A is a block diagram of peak amplifier 130 illustrated in FIG. 1, according to one embodiment of the invention. In the FIG. 4A embodiment of the invention, peak amplifier 130 is a two-stage amplifier and includes an input matching unit 405, a first stage amplifier 410, an inter-stage matching unit 415 and a second stage amplifier/voltage control unit 420. Various embodiments of second stage amplifier/voltage control unit 420 are discussed below in conjunction with FIGS. 4B–4D.

In one embodiment of the invention, input matching unit 405 is configured as input matching unit 305 (FIG. 3B) with electrical characteristics of inductor 306 (FIG. 3B), capacitor 307 (FIG. 3B), and capacitor 308 (FIG. 3B) selected such that an output impedance of 3 dB hybrid coupler 110 (FIG.

1) is matched to an input impedance of peak amplifier 130, measured at a terminal 40. Similarly, inter-stage matching unit 415 is configured as inter-stage matching unit 315 (FIG. 3C) with electrical characteristics of capacitor 309 (FIG. 3C), inductor 311 (FIG. 3C), and capacitor 312 (FIG. 3C) selected such that an output impedance of first stage amplifier 410 is matched to an input impedance of second stage amplifier/voltage control unit 420. Finally, first stage amplifier 410 is configured as first stage amplifier 310 (FIG. 3D) with electrical characteristics of first stage base bias elements (i.e., resistor 313, diode 314, diode 316, resistor 317, capacitor 318, and transistor Q1A 319), first stage collector bias elements (i.e., transmission line 321 and capacitor 322), and transistor Q11 345 (FIG. 3D) selected such that first stage amplifier 410 operates according to predefined specifications, such as gain, normal mode, and cutoff mode specifications.

Figure 4B:
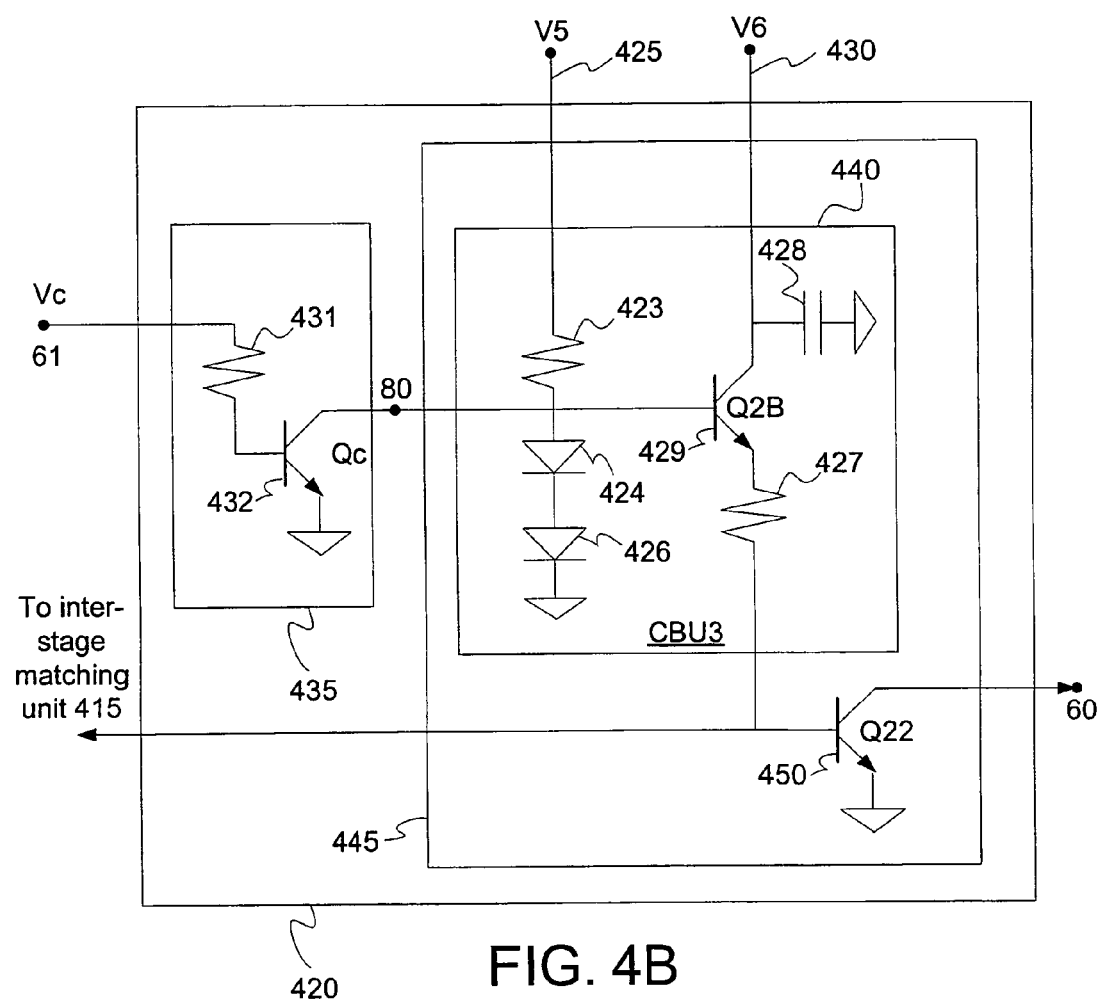
FIG. 4B is a block diagram of the second stage amplifier/voltage control unit illustrated in FIG. 4A, according to one embodiment of the invention.

FIG. 4B is a block diagram of second stage amplifier/voltage control unit 420 illustrated in FIG. 4A, according to one embodiment of the invention. The second stage amplifier/voltage control unit 420 includes a second stage amplifier 445 and a voltage control unit 435. Second stage amplifier 445 is configured as second stage amplifier 320 (FIG. 3E). For example, second stage amplifier 445 includes a CBU3 440 and a transistor Q22 450. CBU3 440 includes a resistor 423, a diode 424, a diode 426, a resistor 427, a capacitor 428, and a transistor Q2B 429, collectively referred to as second stage peak amplifier base bias elements. In operation, electrical characteristics of the second stage peak amplifier base bias elements are selected in conjunction with DC bias voltages V5 and V6 to bias a base of transistor Q22 450 for normal-mode operation, based upon operating characteristics of transistor Q22 450 and specifications of power amplifier 100 (FIG. 1). For example, resistor 423 may have a resistance in a range of several hundred Ohms to several kilo-Ohms, resistor 427 may have a resistance in a range of several Ohms to several hundred Ohms, a Q2B:Q22 transistor size ratio may be approximately in a range of 1:4 to 1:10, DC bias voltage V3 may be in a range of 2.8V to 3.0V, and DC bias voltage V4 may be in a range of 3.2V to 4.2V. Second stage amplifier 445 receives a signal from inter-stage matching unit 415, amplifies the received signal based upon the voltage control signal Vc received by voltage control unit 435, and sends the amplified signal to peak amplifier output terminal 60.

Voltage control unit 435 receives the voltage control signal Vc (typically in a range of 2.8V to 4.2V), and controls a DC bias current of second stage amplifier 445. In the FIG. 4B embodiment of the invention, voltage control unit 435 includes a resistor 431 and a transistor Qc 432. Typically, resistor 431 has a resistance in a range of several hundred Ohms to several kilo-Ohms, and a Qc:Q2B transistor size ratio may be approximately in a range of 1:1 to 1:8. In operation, a baseband modem chipset (not shown) reads power levels of RF signals received by the handset. The baseband modem chipset processes the signals, determines the required output power level of the power amplifier 100, and generates the voltage control signal Vc according to the required output power level. Voltage control unit 435 then receives the voltage control signal Vc from the baseband modem chipset. In another embodiment of the invention, power amplifier 100 includes RF processing circuitry (not shown) for processing the signals received by the baseband modem chipset. In this embodiment, the RF processing circuitry generates the voltage control signal Vc, and sends the voltage control signal to the voltage control unit 435. The RF processing circuitry and the baseband modem chipset are well known in the art, and will not be described in further detail.

Typically, the baseband modem chipset generates the voltage control signal Vc based upon power levels of signals transmitted by the base station and received by the baseband modem chipset in the handset. For example, if the baseband modem chipset, upon receiving the signals from the base station, determines that power amplifier 100 operates in a low power output range, the baseband modem chipset sends a "high" voltage control signal Vc (i.e., a high voltage state signal) to voltage control unit 435. However, if the baseband modem chipset, upon receiving the signals from the base station, determines that power amplifier 100 operates in a high power output range, the baseband modem chipset sends a "low" voltage control signal Vc (i.e., low voltage state signal) to voltage control unit 435. The scope of the invention covers a voltage control signal Vc corresponding to any voltage state and to any power output range.

In operation, if the baseband modem chipset transmits a low voltage state control signal Vc to peak amplifier 130 that indicates power amplifier 100 operates in the high power output range, the voltage control unit 435 receives the low voltage state control signal Vc and sets a DC bias current of second stage amplifier 445 of peak amplifier 130 (FIG. 4A) via the received low voltage state control signal Vc. The low voltage state control signal Vc turns off transistor Qc 432, increases base-emitter currents (not shown) of transistors Q2B 429 and Q22 450, and biases peak amplifier 130 as a class AB amplifier.

However, if the baseband modem chipset transmits a high voltage state control signal Vc to peak amplifier 130 that indicates power amplifier 100 operates in the low power output range, the voltage control unit 435 receives the high voltage state control signal Vc and sets a DC bias current of second stage amplifier 445 of peak amplifier 130 via the received high voltage state control signal Vc. The high voltage state control signal Vc turns on transistor Qc 432, and diverts base-emitter current of transistor Q2B 429 to collector-emitter current of transistor Qc 432. Thus, base-emitter currents of transistors Q2B 429 and Q22 450 decrease, and peak amplifier 130 is biased as either a class B or class C amplifier, dependent upon a resultant bias state of transistor Q22 450.

Figure 4C:
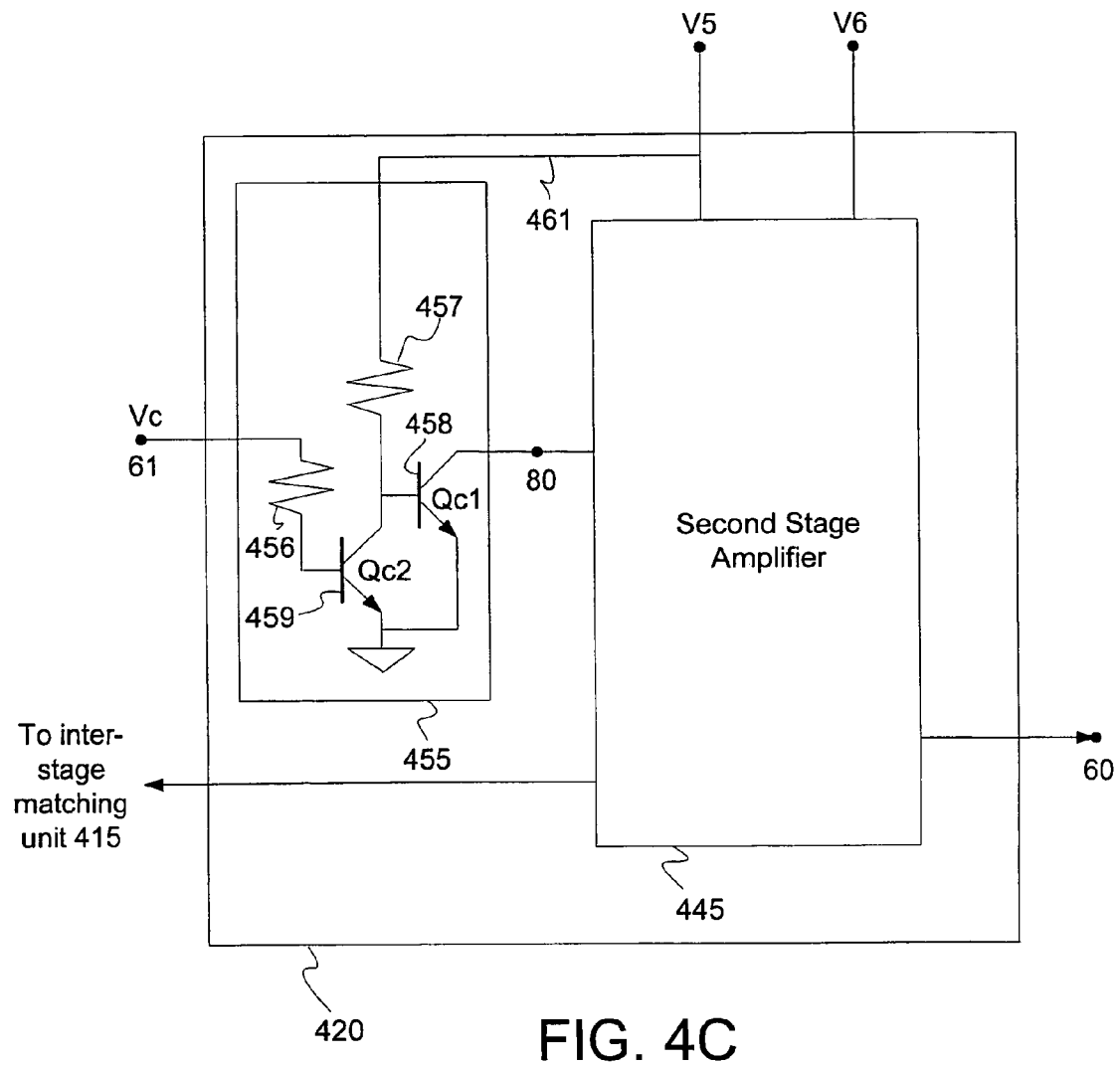
FIG. 4C is a block diagram of the second stage amplifier/voltage control unit illustrated in FIG. 4A, according to another embodiment of the invention.

FIG. 4C is a block diagram of second stage amplifier/voltage control unit 420 illustrated in FIG. 4A, according to another embodiment of the invention. Second stage amplifier/voltage control unit 420 includes second stage amplifier 445 and a voltage control unit 455. Second stage amplifier 445 is identically configured as second stage amplifier 445 illustrated in FIG. 4B. Voltage control unit 455 includes a resistor 456, a resistor 457, a transistor Qc1 458, and a transistor Qc2 459. In addition, a DC bias voltage V5 is applied to voltage control unit 455 via a line 461. Typically, resistor 456 has a resistance in a range of several hundred Ohms to several kilo-Ohms, resistor 457 has a resistance in a range of several Ohms to several hundred Ohms, a Qc2:Qc1 transistor size ratio may be approximately in a range of 1:1 to 1:10, a Qc1:Q2B (FIG. 4B) transistor size ratio may be approximately in a range of 1:1 to 1:8, DC bias voltage V3 may be in a range of 2.8V to 3.0V, a DC bias voltage V4 may be in a range of 3.2V to 4.2V, and a voltage control signal Vc may be in a range of 2.8V to 4.2V.

Input/output characteristics of voltage control unit 455 are opposite to input/output characteristics of voltage control unit 435 (FIG. 4B). That is, a low voltage state control signal Vc received at a terminal 61 biases peak amplifier 130 (FIG.

4A) as either a class B or a class C amplifier dependent upon a resultant bias state of transistor Q22 450 (FIG. 4B), and a high voltage state control signal Vc biases peak amplifier 130 as a class AB amplifier.

Figure 4D:
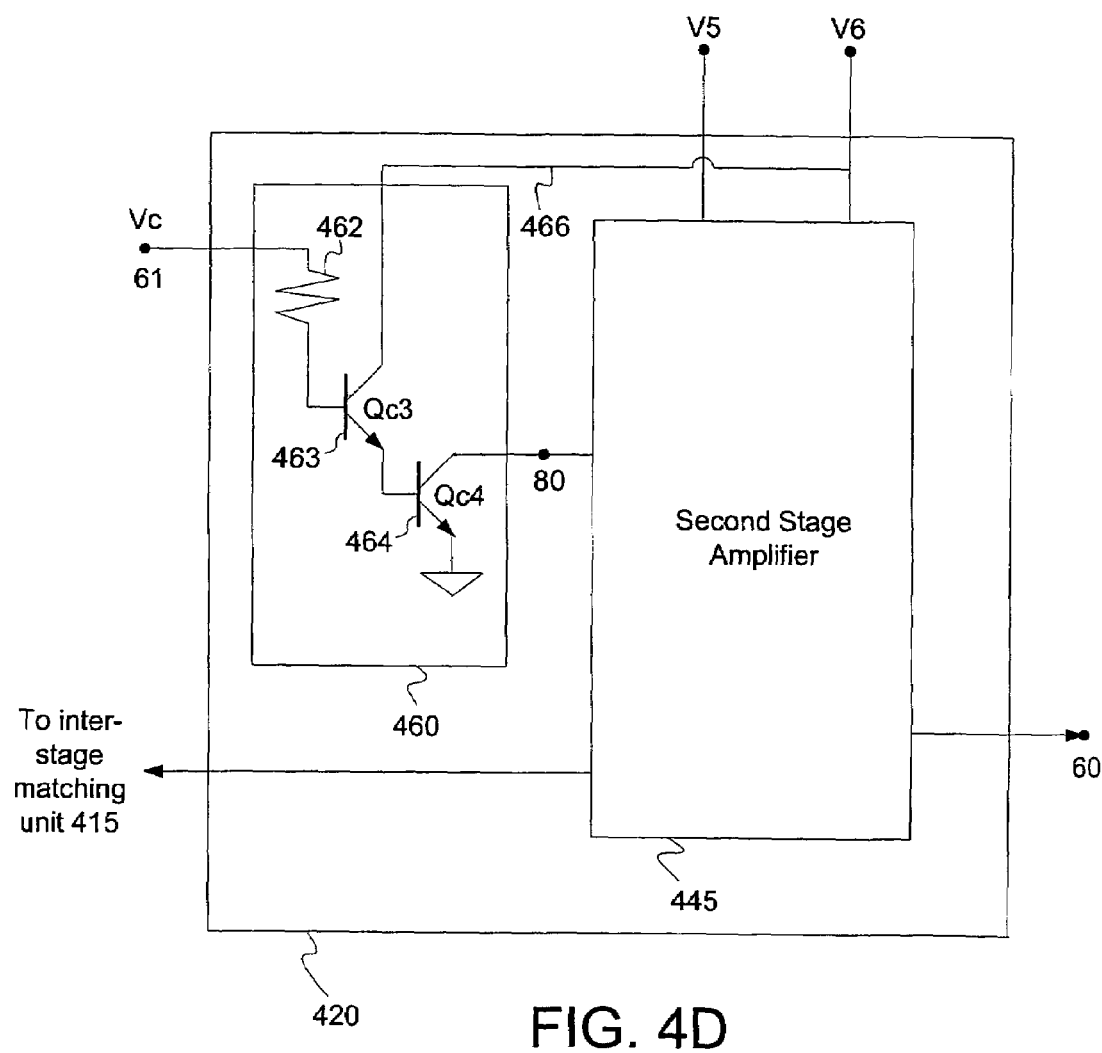
FIG. 4D is a block diagram of the second stage amplifier/voltage control unit illustrated in FIG. 4A, according to yet another embodiment of the invention.

FIG. 4D is a block diagram of second stage amplifier/voltage control unit 420 illustrated in FIG. 4A, according to yet another embodiment of the invention. Second stage amplifier/voltage control unit 420 includes second stage amplifier 445 and a voltage control unit 460. Second stage amplifier 445 is identically configured as second stage amplifier 445 illustrated in FIG. 4B. Voltage control unit 460 includes a resistor 462, a transistor Qc3 463, and a transistor Qc4 464. In addition, a DC bias voltage V6 is applied to voltage control unit 460 via a line 466. Typically, resistor 462 has a resistance in a range of several hundred Ohms to several kilo-Ohms, a Qc3:Qc4 transistor size ratio may be approximately in a range of 1:1 to 1:10, a Qc4:Q2B (FIG. 4B) transistor size ratio may be approximately in a range of 1:1 to 1:8, a DC bias voltage V3 may be in a range of 2.8V to 3.0V, DC bias voltage V4 may be in a range of 3.2V to 4.2V, and a voltage control signal Vc may be in a range of 2.8V to 4.2V.

Input/output characteristics of voltage control unit 460 are similar to input/output characteristics of voltage control unit 435 (FIG. 4B). That is, a low voltage state control signal Vc biases peak amplifier 130 as a class AB amplifier, and a high voltage state control signal Vc biases peak amplifier 130 as either a class B or a class C amplifier, dependent upon a resultant bias state of transistor Q22 450 (FIG. 4B).

Figure 5:
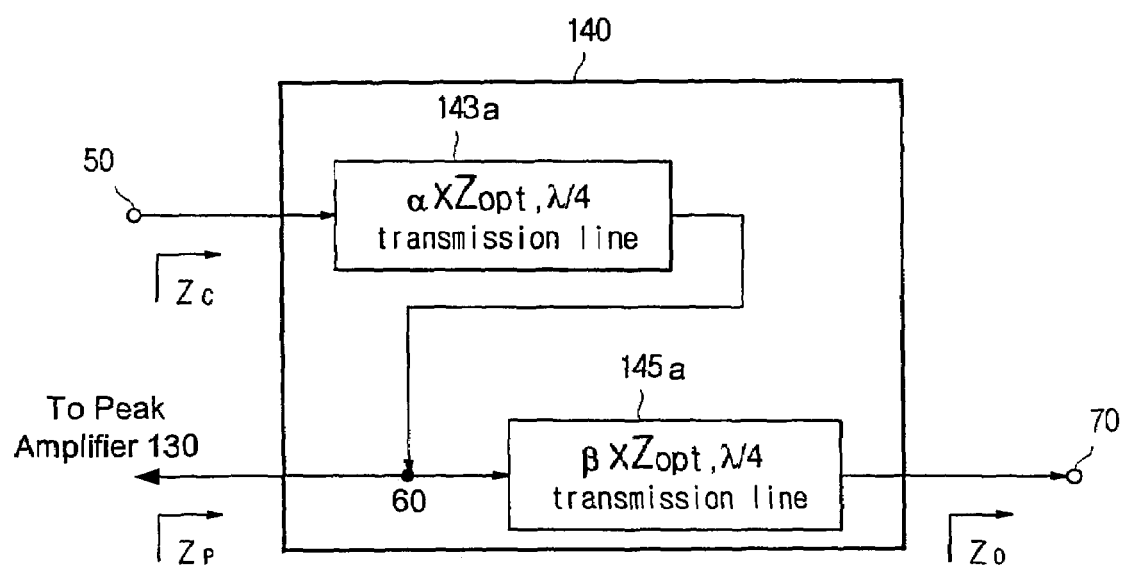
FIG. 5 is a block diagram of one embodiment of output matching unit illustrated in FIG. 1, according to the invention.

FIG. 5 is a block diagram of output matching unit 140 illustrated in FIG. 1, according to one embodiment of the invention. In the FIG. 5 embodiment of the invention, first λ/4 transformer 143 (FIG. 1) is implemented as a first λ/4 transmission line 143a, and second λ/4 transformer 145 (FIG. 1) is implemented as a second λ/4 transmission line 145a. By adjusting α and β (either individually or both) of first λ/4 transmission line 143a and second λ/4 transmission line 145a, respectively, in output matching unit 140, the characteristic impedances of first λ/4 transmission line 143a and second λ/4 transmission line 145a change. By optimizing α and β, the carrier amplifier 120 (FIG. 1) may achieve the maximum efficiency at an output power level that is lower than the highest output power level that carrier amplifier 120 may generate.

Figure 6A:
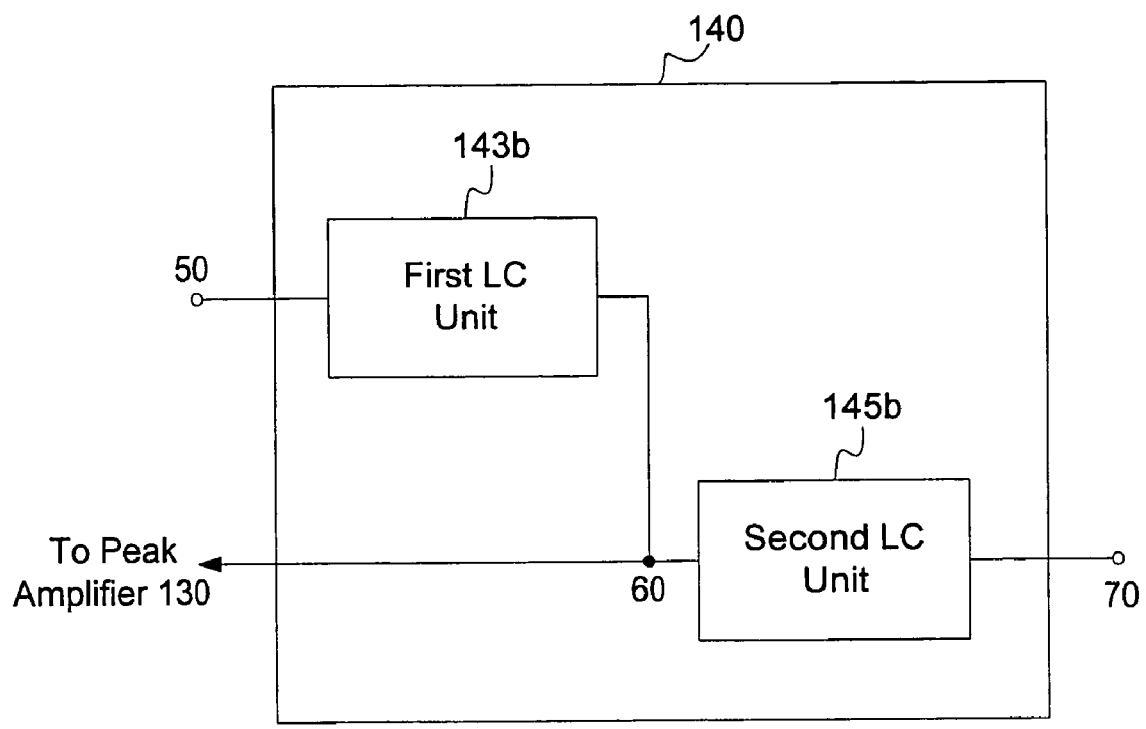
FIG. 6A is a block diagram of another embodiment of output matching unit illustrated in FIG. 1, according to the invention.

FIG. 6A is a block diagram of output matching unit 140 illustrated in FIG. 1, according to another embodiment of the invention. First λ/4 transformer 143 (FIG. 1) is implemented as a first LC unit 143b, and second λ/4 transformer 145 (FIG. 1) is implemented as a second LC unit 145b. Typically, first LC unit 143b and second LC unit 145b are comprised of lumped inductive and capacitive elements, and are discussed further below in conjunction with FIGS. 6B–6C. The lumped inductive and capacitive elements of first LC unit 143b advantageously provide the impedance inversion characteristics and functionality of first λ/4 transmission line 143a (FIG. 5) without the space requirements of first λ/4 transmission line 143a. Furthermore, the lumped inductive and capacitive elements of second LC unit 145b advantageously provide the impedance transformation properties and functionality of second λ/4 transmission line 145a (FIG. 5) without the space requirements of second λ/4 transmission line 145a.

For example, in an exemplary embodiment of the invention, if power amplifier 100 (FIG. 1) drives a 50 ohm load (not shown) coupled to output stage 70, and if an input impedance of 10 ohms (looking into second LC unit 145b) is required at peak amplifier output terminal 60 for efficient performance of power amplifier 100, then the electrical characteristics of the lumped inductive and capacitive elements of second LC unit 145b are selected such that second LC unit 145b in combination with the 50 ohm load gives a 10 ohm input impedance at peak amplifier output terminal 60, and the electrical characteristics of the lumped inductive and capacitive elements of LC unit 143b are selected such that an impedance measured at carrier amplifier output terminal 50 is an inverse of the input impedance at peak amplifier output terminal 60. The scope of the invention covers any values and combinations of load impedances coupled to output stage 70 and input impedances at peak amplifier output terminal 60.

Figure 6B:
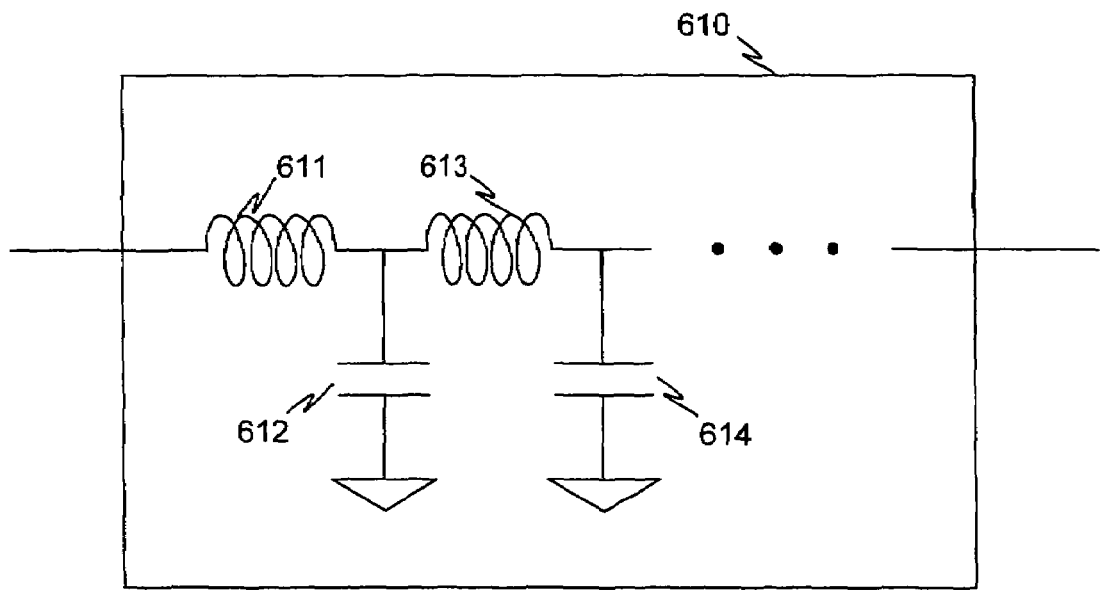
FIG. 6B is a block diagram of one embodiment of first Inductor-Capacitor circuit (LC) unit and second LC unit of FIG. 6A, according to the invention.
Figure 6C:
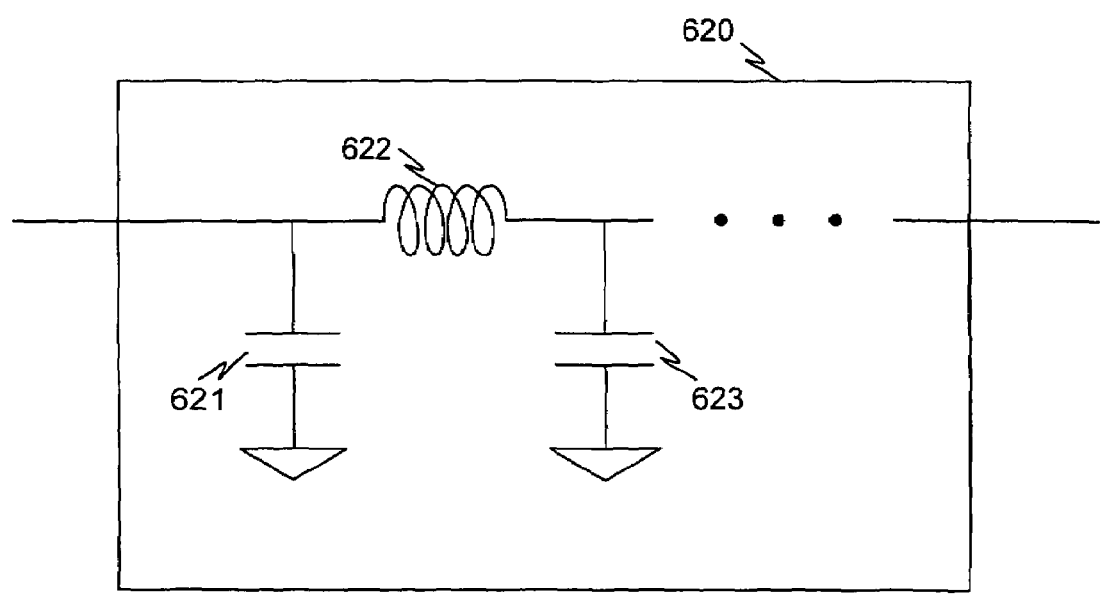
FIG. 6C is a block diagram of another embodiment of first LC unit and second LC unit of FIG. 6A, according to the invention.

FIGS. 6B–6C illustrate configurations of first LC unit 143b and second LC unit 145b of FIG. 6A, according to one embodiment of the invention. First LC unit 143b (FIG. 6A) may be implemented by a first LC circuit 610, or alternatively, first LC unit 143b may be implemented by a second LC circuit 620. Similarly, second LC unit 145b (FIG. 6A) may be implemented by first LC circuit 610, or alternatively, second LC unit 145b may be implemented by second LC circuit 620.

First LC circuit 610 includes an inductor 611, a capacitor 612, an inductor 613, and a capacitor 614. Second LC circuit 620 includes a capacitor 621, an inductor 622, and a capacitor 623. Electrical characteristics of elements 611, 612, 613, 614, 621, 622, and 623 are selected such that first LC unit 143b (FIG. 6A) functions as an impedance inverter which provides an impedance at carrier amplifier output terminal 50 that is inversely proportional to a predetermined impedance at peak amplifier output terminal 60, and second LC unit 145b (FIG. 6A) functions as a impedance transformer which provides the predetermined impedance at peak amplifier output terminal 60 given a load (not shown) coupled to output stage 70.

Figure 7A:
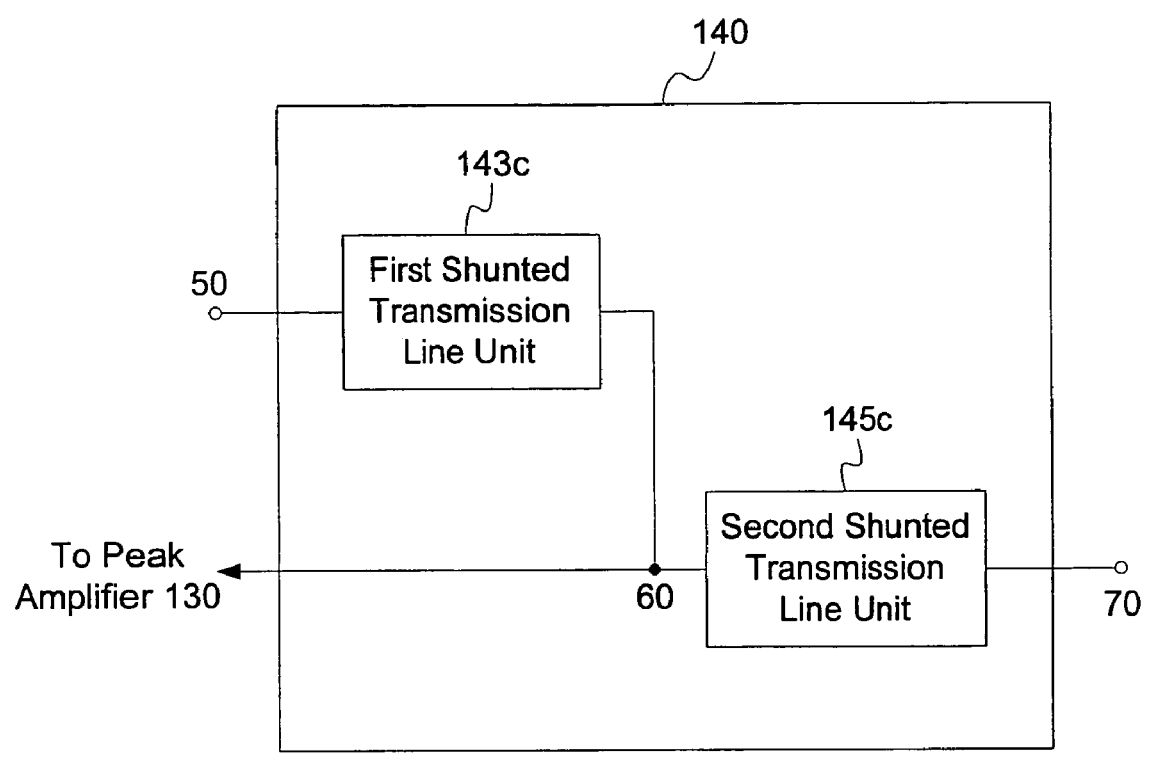
FIG. 7A is a block diagram of a further embodiment of output matching unit illustrated in FIG. 1, according to the invention.

FIG. 7A is a block diagram of output matching unit 140 illustrated in FIG. 1, according to yet another embodiment of the invention. First λ/4 transformer 143 (FIG. 1) is implemented as a first shunted transmission line unit 143c, and second λ/4 transformer 145 (FIG. 1) is implemented as a second shunted transmission line unit 145c. According to the invention, first shunted transmission line unit 143c and second shunted transmission line unit 145c comprise transmission lines and shunt capacitors, and are discussed further below in conjunction with FIGS. 7B–7H.

Figure 7B:
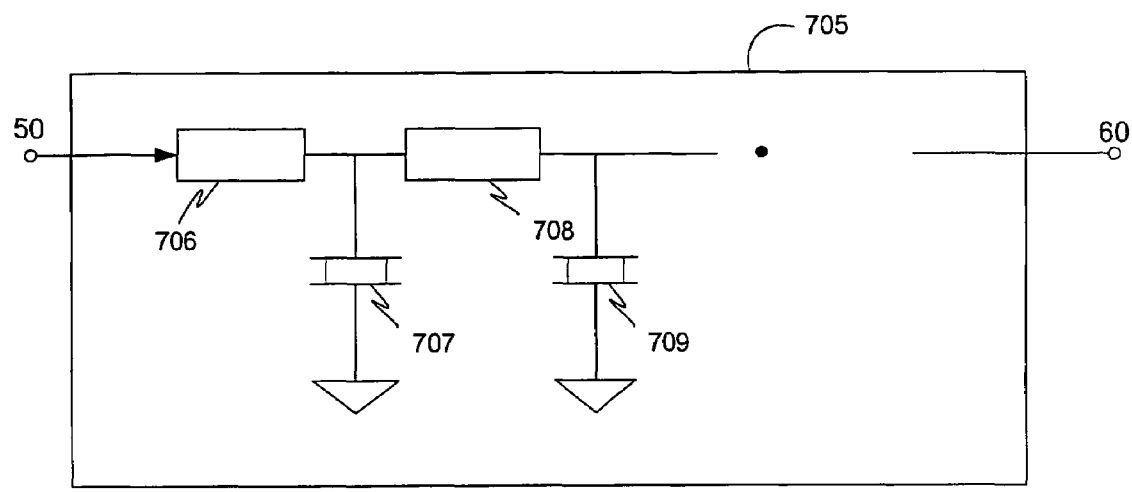
FIG. 7B is a block diagram of one embodiment of first shunted transmission line unit illustrated in FIG. 7A, according to the invention.
Figure 7C:
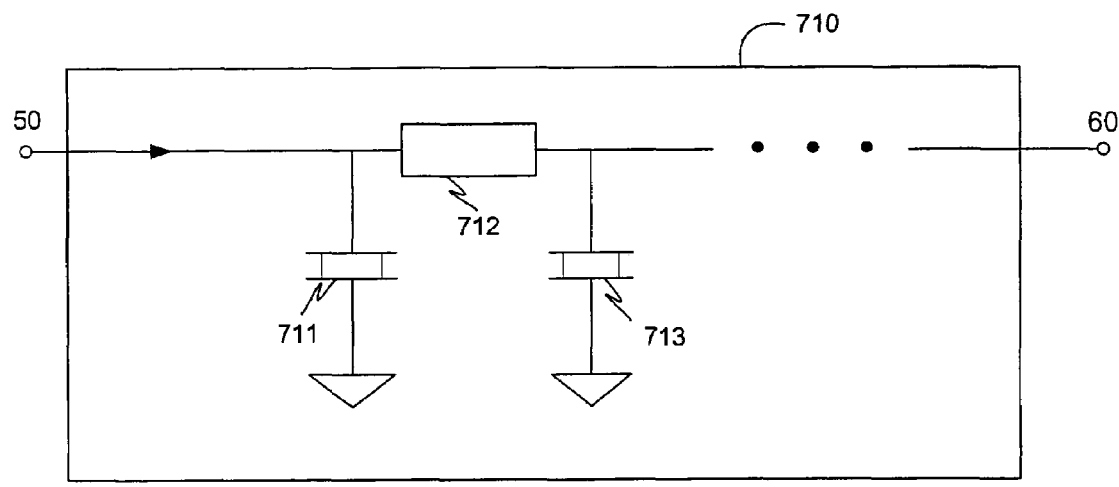
FIG. 7C is a block diagram of another embodiment of first shunted transmission line unit illustrated in FIG. 7A, according to the invention.
Figure 7D:
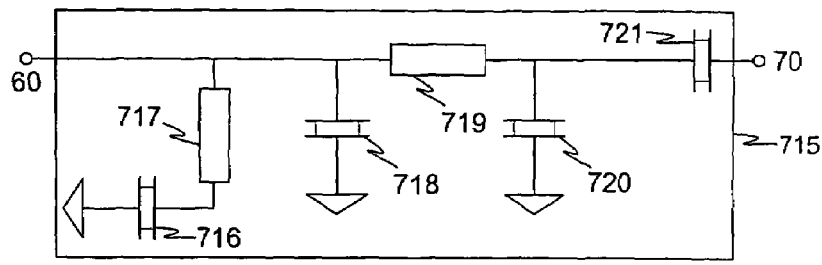
FIG. 7D is a block diagram of a first embodiment of second shunted transmission line unit illustrated in FIG. 7A, according to the invention.
Figure 7E:
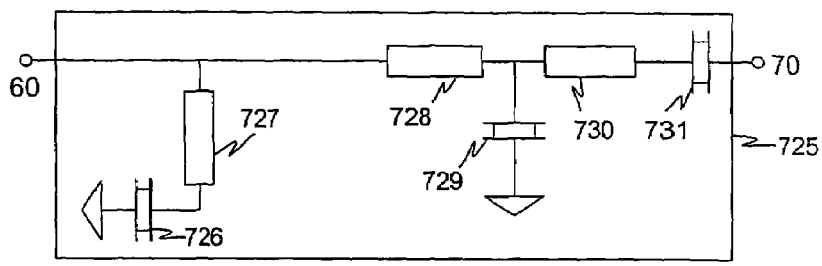
FIG. 7E is a block diagram of a second embodiment of second shunted transmission line unit illustrated in FIG. 7A, according to the invention.
Figure 7F:
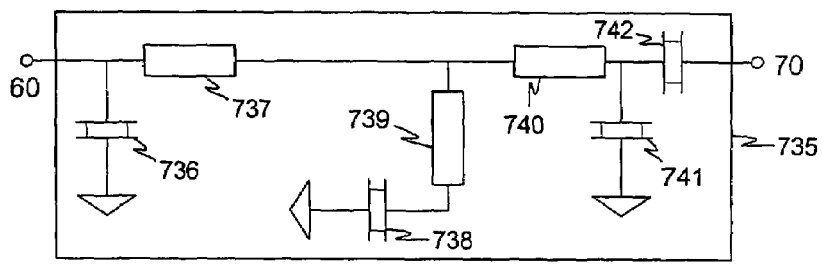
FIG. 7F is a block diagram of a third embodiment of second shunted transmission line unit illustrated in FIG. 7A, according to the invention.
Figure 7G:
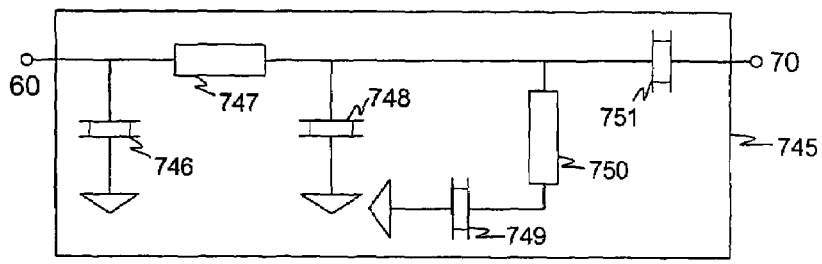
FIG. 7G is a block diagram of a fourth embodiment of second shunted transmission line unit illustrated in FIG. 7A, according to the invention.
Figure 7H:
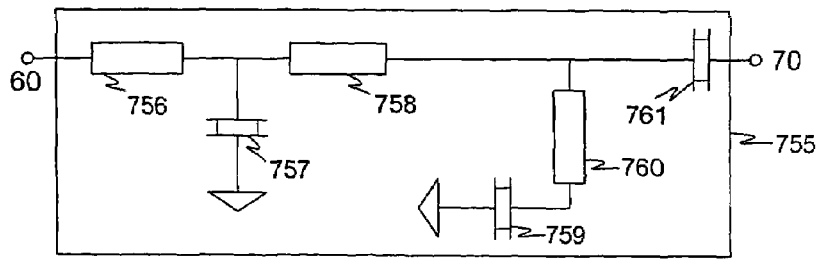
FIG. 7H is a block diagram of a fifth embodiment of second shunted transmission line unit illustrated in FIG. 7A, according to the invention.

FIGS. 7B–7C illustrate alternate configurations of first shunted transmission line unit 143c, according to the invention. For example, first shunted transmission line unit 143c (FIG. 7A) may be implemented by a first shunted transmission line 705, or alternatively, first shunted transmission line unit 143c may be implemented by a second shunted transmission line 710. First shunted transmission line 705 includes a transmission line 706, a capacitor 707, a transmission line 708, and a capacitor 709. Second shunted transmission line 710 includes a capacitor 711, a transmission line 712, and a capacitor 713. Electrical characteristics of elements 706, 707, 708, 709, 711, 712, and 713 are selected such that first shunted transmission line unit 143c (FIG. 7A) functions as an impedance inverter which provides an impedance at carrier amplifier output terminal 50 that is inversely proportional to an impedance at peak amplifier output terminal 60.

As an example of design considerations of first shunted transmission line unit 143c (FIG. 7A), operating principles of the FIG. 7C embodiment of first shunted transmission line unit 143c will now be discussed. In operation, shunt capacitors 711 and 713 periodically load transmission line 712, providing an effective lossless LC equivalent circuit, and reducing phase velocities of electromagnetic waves propagating along transmission line 712. The slow-wave structure of the electromagnetic waves allows for implementation of shorter length transmission lines. For example, for a given power amplifier signal frequency of 1 GHz, the signal wavelength in vacuum is 30 cm and the signal wavelength in a waveguide (i.e., in power amplifier 100) is approximately 10 cm. Therefore, a length of first λ/4 (non-shunted) transmission line 143a (FIG. 5) of approximately 20 mm is required to provide a 90° (i.e., λ/4) phase shift. However, the FIG. 7C embodiment of the invention allows design engineers to advantageously implement transmission line 712 with a length of 10 mm or less to provide the 90° phase shift, due to the slow-wave structure of the electromagnetic waves propagating along transmission line 712. Therefore, implementation of first λ/4 transformer 143 (FIG. 1) with first or second shunted transmission lines 705 and 710, respectively, result in design advantages to power amplifier 100, such as a size reduction to first λ/4 transformer 143, for example.

FIGS. 7D–7H illustrate various configurations of second shunted transmission line unit 145c illustrated in FIG. 7A, according to the invention. For example, second shunted transmission line unit 143c may be implemented by a third shunted transmission line 715 comprised of a capacitor 716, a transmission line 717, a capacitor 718, a transmission line 719, a capacitor 720, and a capacitor 721, collectively referred to as "third shunted transmission line components"; a fourth shunted transmission line 725 comprised of a capacitor 726, a transmission line 727, a transmission line 728, a capacitor 729, a transmission line 730, and a capacitor 731, collectively referred to as "fourth shunted transmission line components"; a fifth shunted transmission line 735 comprised of a capacitor 736, a transmission line 737, a capacitor 738, a transmission line 739, a transmission line 740, a capacitor 741, and a capacitor 742, collectively referred to as "fifth shunted transmission line components"; a sixth shunted transmission line 745 comprised of a capacitor 746, a transmission line 747, a capacitor 748, a capacitor 749, a transmission line 750, and a capacitor 751, collectively referred to as "sixth shunted transmission line components"; or a seventh shunted transmission line 755 comprised of a transmission line 756, capacitor 757, a transmission line 758, a capacitor 759, a transmission line 760, and a capacitor 761, collectively referred to as "seventh shunted transmission line components." Electrical characteristics of the third, fourth, fifth, sixth, and seventh shunted transmission line components are selected such that the corresponding shunted transmission lines 715, 725, 735, 745, and 755 function as impedance transformers that provide a predetermined impedance at peak amplifier output terminal 60 given a predetermined load (not shown) coupled to output stage 70. In operation, some or all of the capacitive elements of the third, fourth, fifth, sixth, and seventh shunted transmission line components shunt the transmission line elements of the third, fourth, fifth, sixth, and seventh shunted transmission line components to reduce the phase velocities of electromagnetic waves. The slow-wave structure of the electromagnetic waves allow design engineers to advantageously implement some or all of the transmission line elements of the third, fourth, fifth, sixth, and seventh shunted transmission line components with a length of λ/4 or less.

Figure 8:
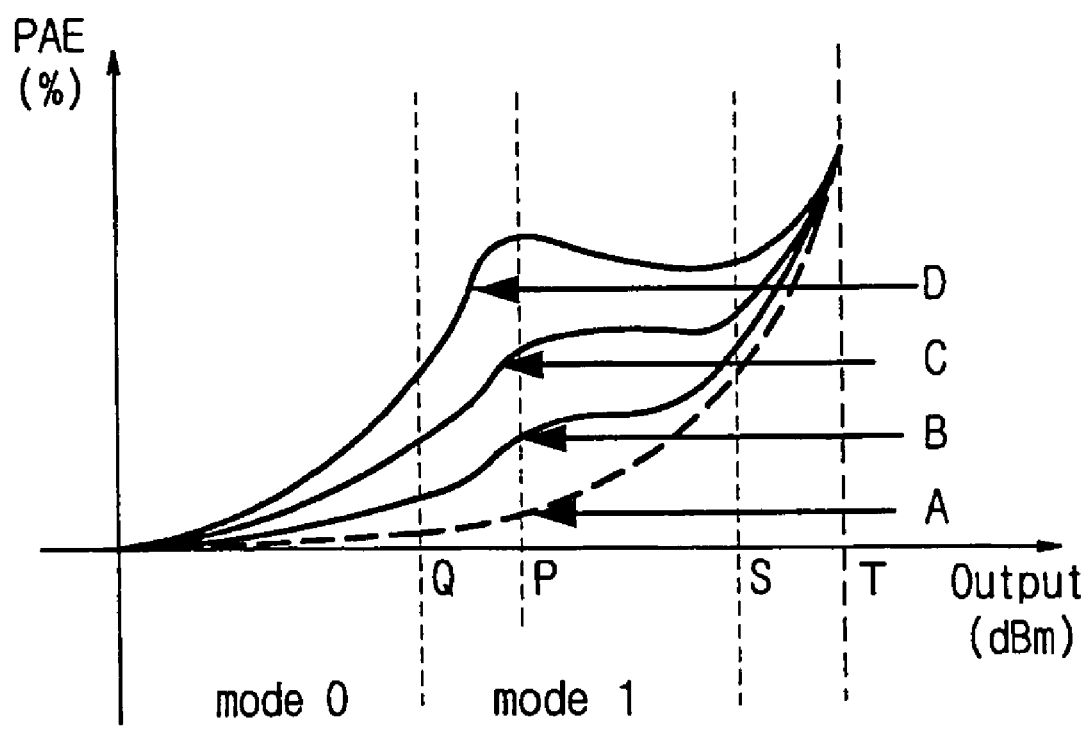
FIG. 8 is a graph illustrating efficiency characteristics dependent on a voltage control signal applied to an exemplary peak amplifier, according to one embodiment of the invention.

FIG. 8 is a graph illustrating efficiency characteristics as determined by, for example, the voltage control signal Vc applied to peak amplifier 130 (FIG. 1). Mode 0 represents the region of amplifier operation in a low output power range (i.e., from a minimum output power in dBm to point Q).

Mode 1 represents the region of amplifier operation in a high output power range (i.e., from point Q to point S and/or T). As a current is increasingly applied to peak amplifier 130, an exemplary power amplifier according to an embodiment operates first as shown as curve D. Curves C and B represent the efficiency characteristics associated with the exemplary power amplifier as the amount of DC bias current increases beyond that associated with curve D. Curve A represents the efficiency characteristics of a general power amplifier.

As current starts to flow in peak amplifier 130, peak amplifier 130 commences its operation. This changes the output impedance of carrier amplifier 120, thereby optimizing efficiency of power amplifier 100 to a certain constant level as indicated by D in FIG. 8. Accordingly, as indicated by curve D in FIG. 8, the Power Added Efficiency (PAE) has the maximum value from the point P (when peak amplifier 130 starts to operate) to either point S, which is the highest allowable output power satisfying the given linearity conditions, or point T, which is the saturated output power, as generated by power amplifier 100. Thus, as illustrated, improved efficiency characteristics are achieved through an exemplary power amplifier, according to an embodiment of the invention, in comparison with the efficiency characteristic of a general power amplifier indicated by curve A in FIG. 8. As described above, this is made possible by operating peak amplifier 130 at class B or C.

Figure 9:
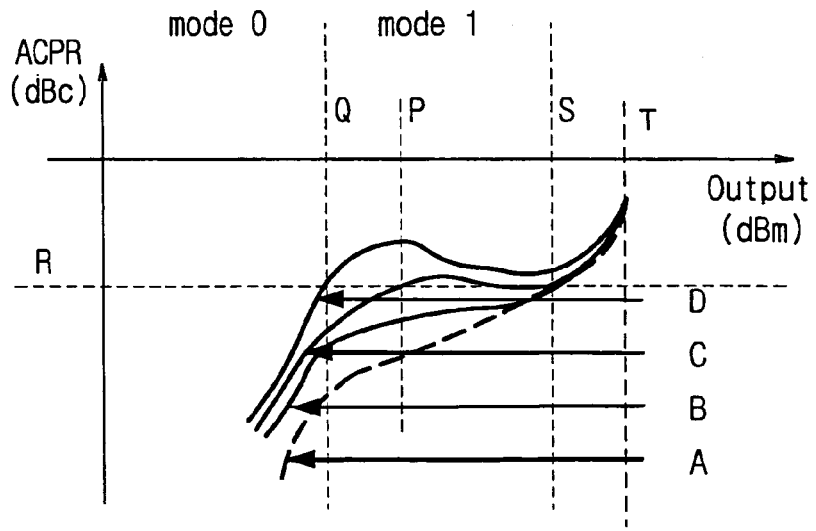
FIG. 9 is a graph illustrating non-linearity characteristics dependent on a voltage control signal applied to an exemplary peak amplifier, according to one embodiment of the invention.

However, illustrated by the graph of FIG. 9 are non-linearity characteristics as the voltage control signal Vc is applied to peak amplifier 130. In this graph, performance of power amplifier 100 is characterized with respect to the Adjacent Channel Power Ratio (ACPR) as the output power is increased. In this instance, values of the overall non-linearity characteristics (as indicated by curve D in FIG. 9) may be difficult to predict and, thus, the non-linear distortion of power amplifier 100 becomes undesirable. Accordingly, ACPR criterion R, which may be required by a specific system, may not be maintained up to the desired output power level associated with point S without violating the ACPR criteria. ACPR criteria are well known and those having ordinary skill in the art understand that R could, for example, represent −42 dBc for a CDMA cellular system or any other value.

In other words, as illustrated in FIG. 8 and FIG. 9, compared with general power amplifiers known in the related art, and if peak amplifier 130 in the power amplifier 100 is operated at class B or C (that is, if the power amplifier 100 is operated in a typical Doherty mode), then power amplifier 100 shows improved efficiency characteristics over conventional power amplifiers used, for example, in wireless communication applications. However, in terms of linearity, the power amplifier might have less predictable values when operating in the high output power range.

Therefore, an exemplary power amplifier in accordance with an embodiment of the invention meets high efficiency and linearity requirements in the low output power range, such as at point Q, where the ACPR criterion R required by the system is satisfied. For low-power mode 0 operation, criterion R is met even if one sets the voltage control signal Vc applied to peak amplifier 130 in such a way that peak amplifier 130 is operated at class B or C where little DC current flows, and thus that power amplifier 100 is operated in the Doherty mode. On the other hand, in the high output power range during mode 1, power amplifier 100 can achieve excellent linearity by adjusting the voltage control signal Vc applied to peak amplifier 130. This linearity can be realized by increasing the DC bias current to second stage amplifier 445 of peak amplifier 130 through decrease of the voltage control signal Vc to a point where the linearity specification (or level of linearity) designated as R in FIG. 9 can be satisfied. In this way, peak amplifier 130 can be biased as a class AB amplifier depending on, for example, the mode of operation. This results in the efficiency and linearity curves of B or C in FIGS. 8 and 9.

Figure 10:
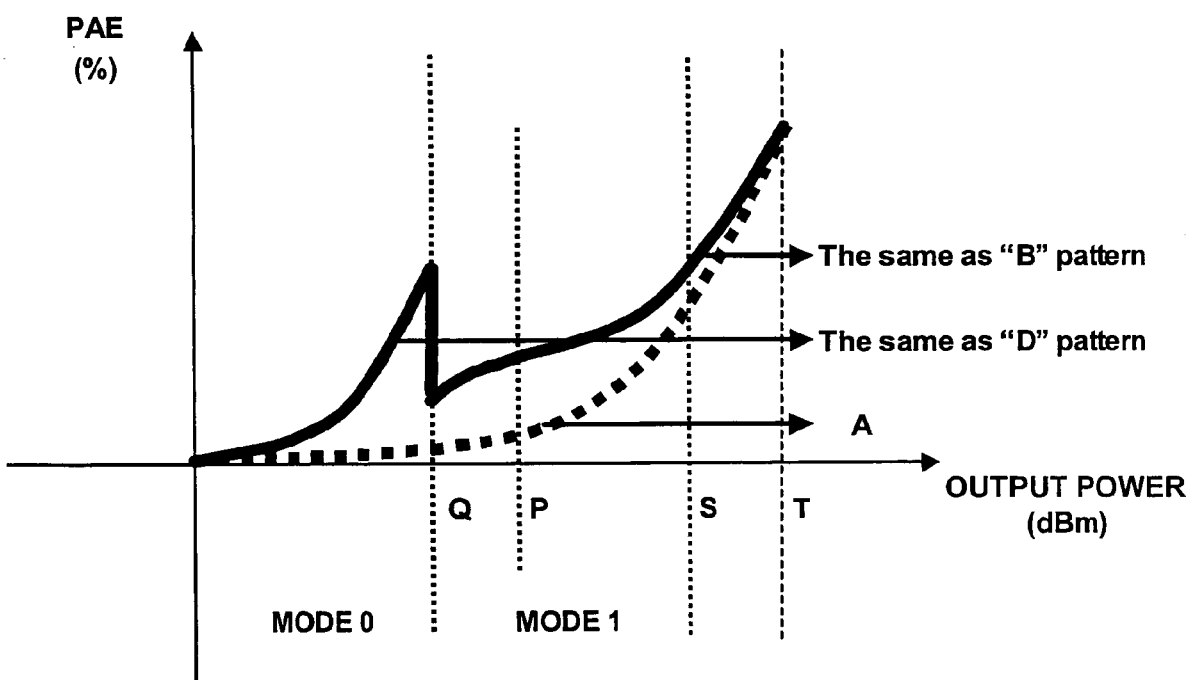
FIG. 10 is a graph illustrating efficiency characteristics corresponding to modes of the power amplifier in accordance with one embodiment of the invention.
Figure 11:
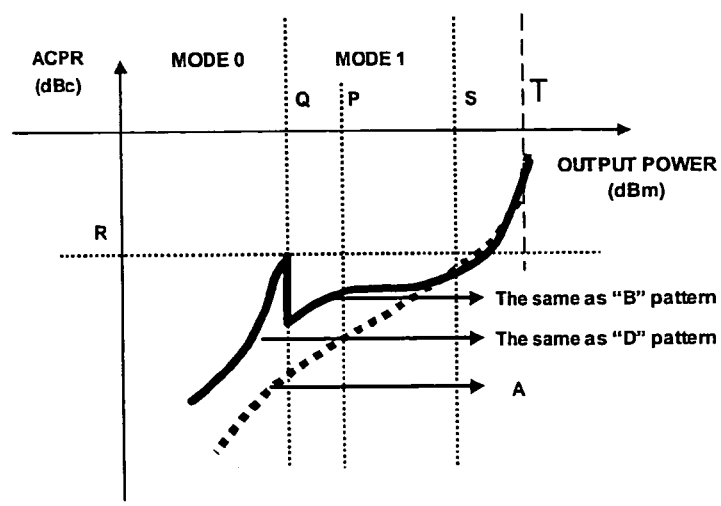
FIG. 11 is a graph illustrating non-linearity characteristics corresponding to modes of the power amplifier in accordance with a specific embodiment of the invention.

FIG. 10 is a graph illustrating efficiency characteristics corresponding to modes of power amplifier 100 (FIG. 1) in accordance with an embodiment of the invention. FIG. 11 is a graph illustrating non-linearity characteristics corresponding to modes of power amplifier 100 in accordance with the invention. In operation of exemplary power amplifier 100, consider FIG. 11. When the power amplifier 100 requires an output power level reaching point Q, where mode switching is needed, the baseband modem chipset (not shown) sends a low voltage state control signal Vc to peak amplifier 130 so that an increased bias current may be applied to peak amplifier 130. In this way, linearity of power amplifier 100 in accordance with an embodiment of the invention is enhanced with a slight reduction in the efficiency. In one embodiment of the invention, point Q is in a range of 10–19 dBm, however, the invention covers other operating output powers at which power amplifier 100 switches modes. Point Q (also referred to as an output power threshold) separates a low power range of operation of power amplifier 100 from a high power range of operation of power amplifier 100. The efficiency and linearity curves in mode 1 are similar to those of curves B (FIGS. 8–9). This prevents criteria R from being violated.

Figure 12:
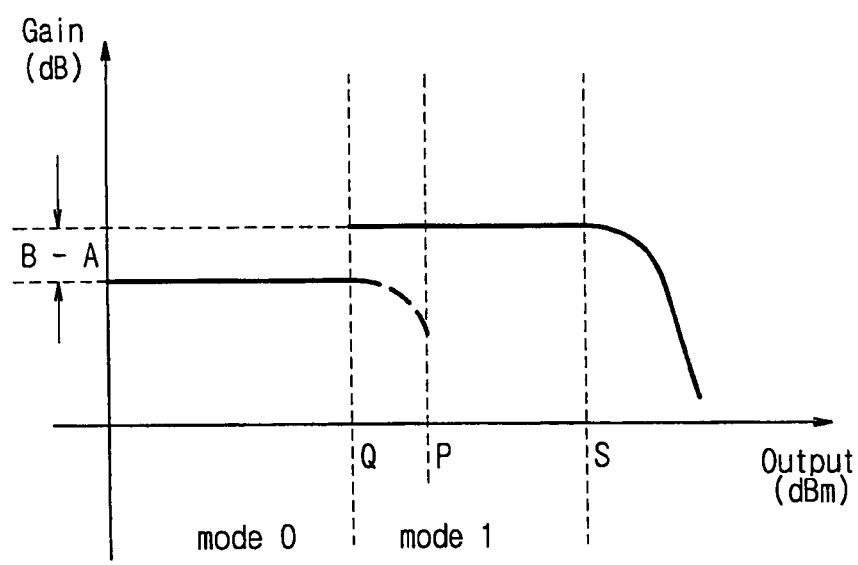
FIG. 12 is a graph illustrating gain characteristics corresponding to modes of the power amplifier in accordance with the invention.

FIG. 12 is a graph illustrating gain characteristics corresponding to modes of power amplifier 100 (FIG. 1) in accordance with the invention. In the invention, carrier amplifier 120 and peak amplifier 130 may be operated to have the same linear gain characteristics. However, the overall system is not affected even if carrier amplifier 120 and peak amplifier 130 are implemented to be operated with different linear gain characteristics since two modes can be distinguished clearly and be operated independently in accordance with a specific embodiment of the invention.

Figure 13:
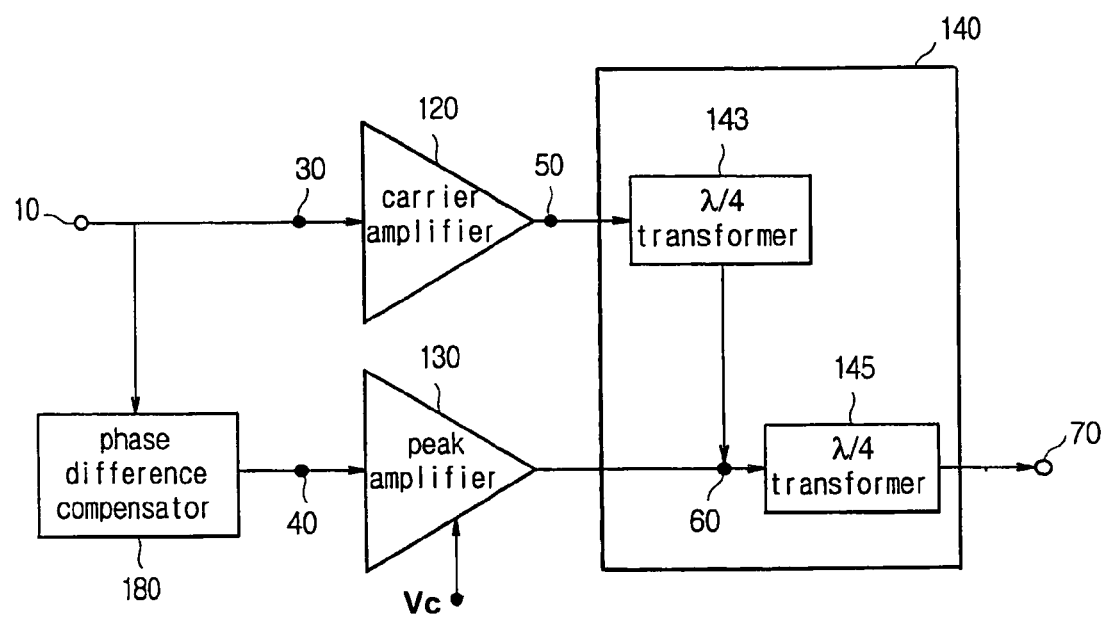
FIG. 13 is a block diagram showing the structure of a power amplifier in accordance with another embodiment of the invention.

FIG. 13 is a block diagram showing the structure of a power amplifier 100' in a mobile handset in accordance with another embodiment of the invention. Power amplifier 100' according to another embodiment of the invention is substantially the same as power amplifier 100 shown in FIG. 1, in terms of the structure and operation. Therefore, the same reference numerals refer to the same parts in the power amplifiers according to FIG. 1 and FIG. 13. Thus, a detailed description of the power amplifier according in FIG. 13 is not necessary for one having ordinary skill in the art and thus is omitted.

As shown in FIG. 13, power amplifier 100' in accordance with another embodiment comprises a phase difference compensator 180 which replaces phase shifter 110 of FIG. 1. Phase difference compensator 180 is coupled to input stage 10 and peak amplifier 130 so that the input signal is applied to peak amplifier 130 and to carrier amplifier 120, where phase difference compensator 180 has a phase difference of 90° (λ/4).

As described above, because input signal applied to peak amplifier 130 and input signal applied to carrier amplifier 120 has a phase difference of 90° (λ/4) through the operation of the phase difference compensator 180, when the output powers from the carrier amplifier 120 and the peak amplifier 130 join in the output matching unit 140, there would be no phase difference and thus the optimum output power may be obtained.

If phase difference compensator 180 is used instead of phase shifter 110, the phase difference compensator 180 may be implemented with one simple transmission line (not shown). Alternatively, the phase difference compensator 180 may be implemented with lumped elements (not shown) because the simple transmission line may be approximated to inductance values. Furthermore, because the phase difference compensator 180 may be integrated within a single chip and/or a single integrated circuit, the overall size of power amplifier 100' may be reduced and the price of power amplifier 100' may also be reduced.

In summary, when a low output power range (mode 0) generated by power amplifier 100 of the mobile handset is adequate for proper functioning of a mobile handset/base station pair, as determined by power levels of signals received by the baseband modem chipset of the mobile handset, then the baseband modem chipset sends a voltage control signal Vc in a first state to peak amplifier 130 such that power amplifier 100 is operated in the Doherty mode (i.e., so that peak amplifier 130 is operated as a class B or C amplifier). In contrast, if a low output power range (mode 0) generated by power amplifier 100 of the mobile handset is inadequate for proper functioning of a mobile handset/base station pair as determined by the power levels of signals received by the baseband modem chipset of the mobile handset, and the base station requires power amplifier 100 of the mobile handset to operate in the high output power range (mode 1), then the baseband modem chipset sends a voltage control signal Vc in a second state to peak amplifier 130 such that DC bias current applied to peak amplifier 130 is increased and the ACPR is improved up to point R where the non-linearity specification of power amplifier 100 is satisfied. In one embodiment of the invention, the voltage control signal Vc in the first state is a high voltage state signal, and the voltage control signal Vc in the second state is a low voltage state signal. In another embodiment of the invention, the voltage control signal Vc in the first state is the low voltage state signal, and the voltage control signal Vc in the second state is the high voltage state signal.

Although several embodiments of the invention have been disclosed for illustrative purposes, those skilled in the art will appreciate that various modifications, additions and substitutions are possible, without departing from the scope and spirit of the invention as disclosed in the accompanying claims.

As described above, an exemplary power amplifier of the invention in a mobile handset that provides improves efficiency and linearity, by controlling a DC bias current applied to a peak amplifier of the mobile handset via a control signal Vc received from a baseband modem chipset according to relevant power levels of signals received by the baseband modem chipset has been shown. For example, in the low output power range, a state of a control signal Vc applied to a peak amplifier is selected so that the power amplifier of the invention is operated in the Doherty mode and, in the high output power range, the state of the control signal Vc applied to the peak amplifier is selected so as to satisfy the non-linearity specification of the power amplifier.

Various features and aspects of the above-described invention may be used individually or jointly. Further, the invention can be utilized in any number of environments and applications beyond those described herein without departing from the broader spirit and scope of the specification. The specification and drawings are, accordingly, to be regarded as illustrative rather than restrictive. The scope of the invention is not limited to the described embodiments and is to be determined solely by the appended claims.

What is claimed is:

1. A system for operating a power amplifier in a mobile handset, comprising:
   a carrier amplifier having a carrier input terminal and a carrier output terminal;
   a peak amplifier having a peak input terminal, a peak output terminal and a control terminal for receiving a voltage control signal, the peak amplifier configured to vary at least one characteristic of the power amplifier based upon the voltage control signal;
   a phase shifter, coupled to the carrier input terminal and the peak input terminal, for generating a peak amplifier input signal delayed in phase from a carrier amplifier input signal; and
   an output matching unit coupled to the carrier output terminal, the peak output terminal, and a power amplifier output stage, the output matching unit including:
      a first $\lambda/4$ transformer, having a first shunted transmission line, for providing a first impedance at the carrier output terminal that is inversely proportional to a second impedance at the peak output terminal, and
      a second $\lambda/4$ transformer for matching an output impedance of the power amplifier to a reference characteristic impedance.

2. The system of claim 1, wherein the first $\lambda/4$ transformer is a first shunted transmission line unit.

3. The system of claim 1, wherein the first shunted transmission line has a length less than a quarter of a wavelength of an input signal to the power amplifier.

4. The system of claim 1, wherein the second $\lambda/4$ transformer is a second shunted transmission line unit.

5. The system of claim 4, wherein the second shunted transmission line unit further comprises at least one transmission line, the at least one transmission line having a length less than a quarter of a wavelength of an input signal to the power amplifier.

6. The system of claim 1, wherein the first $\lambda/4$ transformer is a first Inductor-Capacitor (LC) unit.

7. The system of claim 6, wherein the first LC unit comprises lumped inductive and capacitive elements.

8. The system of claim 1, wherein the second $\lambda/4$ transformer is a second LC unit.

9. The system of claim 8, wherein the second LC unit comprises lumped inductive and capacitive elements.

10. The system of claim 1, wherein the reference characteristic impedance is a power amplifier load coupled to the power amplifier output stage.

11. The system of claim 1, wherein the phase shifter is an active phase shifter, the active phase shifter further comprising:
   a lower differential unit, coupled to an input stage and the peak input terminal, for generating the peak amplifier input signal;
   an upper differential unit, coupled to the input stage and the carrier input terminal, for generating the carrier amplifier input signal; and
   a phase control unit, coupled to the input stage and the upper differential unit, for tuning a phase difference between the peak amplifier input signal and the carrier amplifier input signal within a phase tolerance.

12. The system of claim 11, wherein the active phase shifter further comprises at least one transistor and at least one lumped element integrated on a semiconductor die.

13. The system of claim 1, wherein the phase shifter is a passive phase shifter, the passive phase shifter further comprising capacitive and inductive lumped elements.

14. The system of claim 1, wherein the phase shifter, the carrier amplifier, the peak amplifier, and the output matching unit are integrated on a semiconductor die.

15. The system of claim 1, wherein the at least one characteristic of the power amplifier is linearity.

16. The system of claim 1, further comprising a baseband modem chipset of the mobile handset for receiving signals transmitted by a remote base station and generating the voltage control signal in a first voltage state if power levels of the received signals indicate that the power amplifier operates within a low power range and generating the voltage control signal in a second voltage state if the power levels of the received signals indicate that the power amplifier operates within a high power range.

17. The system of claim 16, wherein the peak amplifier further comprises a voltage control unit configured to receive the voltage control signal and control a bias current of the peak amplifier such that the power amplifier is operated as a Doherty-type amplifier when the voltage control signal is in the first voltage state and the peak amplifier is operated as a class AB amplifier when the voltage control signal is in the second voltage state.

18. A method for signal processing by a Doherty communication amplifier in a mobile handset, the Doherty communication amplifier including a carrier amplifier and a peak amplifier, the method comprising:
   receiving a carrier amplifier output signal;
   receiving a peak amplifier output signal; and
   processing the carrier amplifier output signal and the peak amplifier output signal as a slow-wave structured electromagnetic wave, including reducing the phase velocities of the carrier and peak amplifier signals, to generate a Doherty communication amplifier output signal.

19. The method of claim 18, wherein the processing further comprises processing the carrier amplifier output signal and the peak amplifier output signal as a slow-wave structured electromagnetic wave via capacitively shunted transmission lines.

20. The method of claim 19, wherein at least one of the capacitively shunted transmission lines has a length less than a quarter of a wavelength of a Doherty communication amplifier input signal.

21. The method of claim 18, further comprising:
   processing a Doherty communication amplifier input signal via a phase shifter to generate a differential output, the differential output further comprising a first differential output signal and a second differential output signal, the first differential output signal and the second differential output signal having a phase difference; and
   tuning the phase difference to within a phase tolerance based upon characteristics of the Doherty communication amplifier input signal.

22. The method of claim 21, wherein the phase tolerance is 5%.

23. The method of claim 21, wherein the Doherty communication amplifier input signal characteristics include input signal frequency and input signal power.

24. The method of claim 18, further comprising:
   receiving signals transmitted by a remote base station;
   generating a voltage control signal based upon power levels of the signals transmitted by the remote base station; and
   biasing the peak amplifier via the voltage control signal.

25. The method of claim 24, wherein generating the voltage control signal further comprises generating the voltage control signal in a first state if the power levels of the signals transmitted by the remote base station indicate that the Doherty communication amplifier operates in a low output power range, and generating the voltage control signal in a second state if the power levels of the signals transmitted by the remote base station indicate that the Doherty communication amplifier operates in a high output power range.

26. The method of claim 25, wherein the voltage control signal in the first state biases the peak amplifier as a class B or a class C amplifier.

27. The method of claim 25, wherein the voltage control signal in the second state biases the peak amplifier as a class AB amplifier.

28. The system of claim 25, wherein the low output power range and the high output power range are separated by an output power threshold of 10–19 dBm.

29. A system for signal processing by a Doherty communication amplifier in a mobile handset, the Doherty communication amplifier including a carrier amplifier and a peak amplifier, comprising:
 means for receiving a carrier amplifier output signal;
 means for receiving a peak amplifier output signal; and
 means for processing the carrier amplifier output signal and the peak amplifier output signal as a slow-wave structured electromagnetic wave, including means for reducing the phase velocities of the carrier and peak amplifier output signals, to generate a Doherty communication amplifier output signal.

30. The system of claim 29, wherein the means for processing further comprises means for processing the carrier amplifier output signal and the peak amplifier output signal as a slow-wave structured electromagnetic wave via capacitively shunted transmission lines.

31. The system of claim 29, further comprising
 means for processing a Doherty communication amplifier input signal via a phase shifter to generate a differential output, the differential output further comprising a first differential output signal and a second differential output signal, the first differential output signal and the second differential output signal having a phase difference; and
 means for tuning the phase difference to within a phase tolerance based upon input signal characteristics.

32. The system of claim 29, further comprising
 means for receiving signals transmitted by a remote base station;
 means for generating a voltage control signal based upon power levels of the signals transmitted by the remote base station; and
 means for biasing the peak amplifier via the voltage control signal.

33. The system of claim 32, wherein the means for biasing further comprises means for biasing the peak amplifier as a class B or a class C amplifier.

34. The system of claim 32, wherein the means for biasing further comprises means for biasing the peak amplifier as a class AB amplifier.

* * * * *